(12) United States Patent
Parnell

(10) Patent No.: US 11,387,678 B2
(45) Date of Patent: Jul. 12, 2022

(54) STACKED RESONANT STRUCTURES FOR WIRELESS POWER SYSTEMS

(71) Applicant: Apple Inc., Cupertino, CA (US)

(72) Inventor: Robert S. Parnell, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/994,417

(22) Filed: Aug. 14, 2020

(65) Prior Publication Data

US 2021/0099017 A1 Apr. 1, 2021

Related U.S. Application Data

(60) Provisional application No. 62/907,090, filed on Sep. 27, 2019.

(51) Int. Cl.
*H02J 50/12* (2016.01)
*H01F 27/24* (2006.01)
(Continued)

(52) U.S. Cl.
CPC ............ *H02J 50/12* (2016.02); *H01F 27/24* (2013.01); *H01F 38/14* (2013.01); *H05K 1/0296* (2013.01); *H05K 2201/09236* (2013.01)

(58) Field of Classification Search
CPC .......... H02J 50/12; H01F 27/24; H01F 38/14; H01F 41/043; H01F 3/10; H01F 5/003; H05K 1/0296; H05K 2201/09236
See application file for complete search history.

(56) References Cited

U.S. PATENT DOCUMENTS 6,211,767 B1 * 4/2001 Jitaru ................. H01F 27/2804
                                                             336/200
6,478,975 B1 * 11/2002 Ju ............................ H01L 27/08
                                                             438/723

(Continued)

FOREIGN PATENT DOCUMENTS

CN           109215992 A     1/2019
EP             0352924 A2 *  1/1990 ............. H01F 27/40
(Continued)

OTHER PUBLICATIONS

Stein, "Thin Self-Resonant Structures with a High-Q for Wireless Power Transfer," 2018 IEEE Applied Power Electronics Conference and Exposition (APEC), pp. 1044-1051 (Year: 2018).*

(Continued)

*Primary Examiner* — Pinping Sun
(74) *Attorney, Agent, or Firm* — Treyz Law Group, P.C.; Michael H. Lyons

(57) ABSTRACT

A wireless power system has wireless power transmitting and receiving devices. The transmitting and receiving devices convey wireless power using stacked resonant structures. The stacked resonant structures are self-resonant and have a parallel-coupled inductance and capacitance. The structures include a magnetic core having a central post and stacked ceramic layers within the magnetic core and laterally surrounding the central post. The structures include interleaved first and second sets of antiparallel-oriented C-shaped conductive layers and are driven using drive traces. The drive traces are formed from one of the C-shaped conductive layers or from conductive traces on a drive printed circuit board that underlies the stacked ceramic layers. The traces include one or more loops running around the central post. Host circuitry for the structures may have (Continued)

a central tap terminal coupled to the traces. If desired, a shield layer may overlap the conductive layers.

20 Claims, 22 Drawing Sheets

(51) Int. Cl.
*H05K 1/02* (2006.01)
*H01F 38/14* (2006.01)

(56) References Cited

U.S. PATENT DOCUMENTS

| | | | |
|---|---|---|---|
| 7,679,482 B2* | 3/2010 | Yamada | H01F 17/043 336/212 |
| 7,791,445 B2* | 9/2010 | Manoukian | H01F 5/003 336/200 |
| 7,973,631 B2 | 7/2011 | Gotsch et al. | |
| 8,310,331 B2* | 11/2012 | Wedley | H01F 27/30 336/212 |
| 8,497,601 B2 | 7/2013 | Hall et al. | |
| 8,803,752 B2* | 8/2014 | Lee | H01Q 9/40 343/790 |
| 9,337,251 B2 | 5/2016 | Sturcken | |
| 9,356,659 B2 | 5/2016 | Partovi | |
| 9,806,565 B2* | 10/2017 | An | H02J 50/12 |
| 10,256,667 B2* | 4/2019 | Wakabayashi | H01F 38/14 |
| 2001/0017781 A1* | 8/2001 | Hideaki | H02M 1/096 363/16 |
| 2004/0070481 A1* | 4/2004 | Patel | H01F 27/2804 336/200 |
| 2005/0116802 A1* | 6/2005 | Gomez | H01F 17/0013 336/200 |
| 2005/0212640 A1* | 9/2005 | Chiang | H01F 27/2804 336/200 |
| 2007/0115198 A1* | 5/2007 | Mullenborg | H01Q 5/40 343/788 |
| 2008/0046034 A1* | 2/2008 | Ibrahim | A61N 1/36036 607/55 |
| 2009/0295528 A1* | 12/2009 | Silva | H01F 27/346 336/200 |
| 2012/0068549 A1* | 3/2012 | Karalis | H02J 50/12 307/104 |
| 2012/0241904 A1* | 9/2012 | Wu | H01L 27/08 257/531 |
| 2013/0106198 A1* | 5/2013 | Kuk | H02J 5/005 307/104 |
| 2014/0265580 A1* | 9/2014 | Cooley | H02K 7/1853 307/47 |
| 2017/0133741 A1* | 5/2017 | Kato | G06K 19/07779 |
| 2021/0193381 A1* | 6/2021 | Costinett | H02J 50/005 |

FOREIGN PATENT DOCUMENTS

WO 2018222669 A1 12/2018
WO 2019173579 A1 9/2019

OTHER PUBLICATIONS

Stein et al., Thin Self-Resonant Structures with a High-Q for Wireless Power Transfer, Thayer School of Engineering, Mar. 2018, Dartmouth College, Hanover, NH 03755 USA.

* cited by examiner

US 11,387,678 B2

STACKED RESONANT STRUCTURES FOR WIRELESS POWER SYSTEMS

This application claims the benefit of provisional patent application No. 62/907,090, filed Sep. 27, 2019, which is hereby incorporated by reference herein in its entirety.

FIELD

This relates generally to power systems, and, more particularly, to wireless power systems for charging electronic devices.

BACKGROUND

In a wireless charging system, a wireless power transmitting device such as a charging mat or charging puck wirelessly transmits power to a wireless power receiving device such as a portable electronic device. The portable electronic device has a coil and rectifier circuitry. The coil of the portable electronic device receives alternating-current wireless power signals from a coil in the wireless power transmitting device. The rectifier circuitry converts the received signals into direct-current power.

SUMMARY

A wireless power system has a wireless power transmitting device and a wireless power receiving device. During operation, the wireless power transmitting device transmits wireless power to the wireless power receiving device. The wireless power receiving device receives the wireless power. Rectifier circuitry on the wireless power receiving device supplies a corresponding output voltage to a load.

The wireless power transmitting and receiving devices convey wireless power using stacked resonant structures. The stacked resonant structures are self-resonant and have a parallel-coupled inductance and capacitance. The stacked resonant structures exhibit less loss than in scenarios where separate capacitors and inductive coils are used to transfer the wireless power.

The stacked resonant structures include a magnetic core having a central post and stacked ceramic layers within the magnetic core and laterally surrounding the central post. The stacked resonant structures include a first set of C-shaped conductive layers and a second set of C-shaped conductive layers on the stacked ceramic layers. The first set of C-shaped conductors have a first orientation about the central post and the second set of C-shaped conductors have a second orientation antiparallel to the first orientation about the central post. The first set of C-shaped conductors are interleaved among the second set of C-shaped conductors such that each adjacent pair of C-shaped conductors forms a full conductive loop around the central post to establish the parallel-coupled inductance of the stacked resonant structures. The parallel-coupled capacitance of the stacked resonant structures increases as the number of C-shaped conductive layers increases.

The stacked resonant structures are driven using drive traces. In one suitable arrangement, the drive traces are formed from one of the C-shaped conductive layers. Conductive interconnect structures such as contact pads or conductive pins are used to couple the drive traces to host circuitry such as an inverter or rectifier. In another suitable arrangement, the drive traces are formed from conductive traces on a drive printed circuit board that underlies the stacked ceramic layers. The conductive traces include one or more loops running around the central post. The host circuitry may have a central tap terminal coupled to the drive traces. If desired, a C-shaped shield layer may overlap the C-shaped conductive layers.

DETAILED DESCRIPTION

A wireless power system includes a wireless power transmitting device such as a wireless charging mat or wireless charging puck. The wireless power transmitting device wirelessly transmits power to a wireless power receiving device such as a wristwatch, cellular telephone, tablet computer, laptop computer, or other electronic equipment. The wireless power receiving device uses power from the wireless power transmitting device for powering the device and for charging an internal battery.

The wireless power transmitting device communicates with the wireless power receiving device and obtains information on the characteristics of the wireless power receiving device. In some embodiments, the wireless power transmitting device has multiple power transmitting coils. In such embodiments, the wireless power transmitting device uses information from the wireless power receiving device and/or measurements made in the wireless power transmitting device to determine which coil or coils in the transmitting device are magnetically coupled to wireless power receiving devices. Coil selection is then performed in the wireless power transmitting device. Wireless power is transmitted from the wireless power transmitting device to the wireless power receiving device using selected coil(s) to charge a battery in the wireless power receiving device and/or to power other load circuitry.

Figure 1:
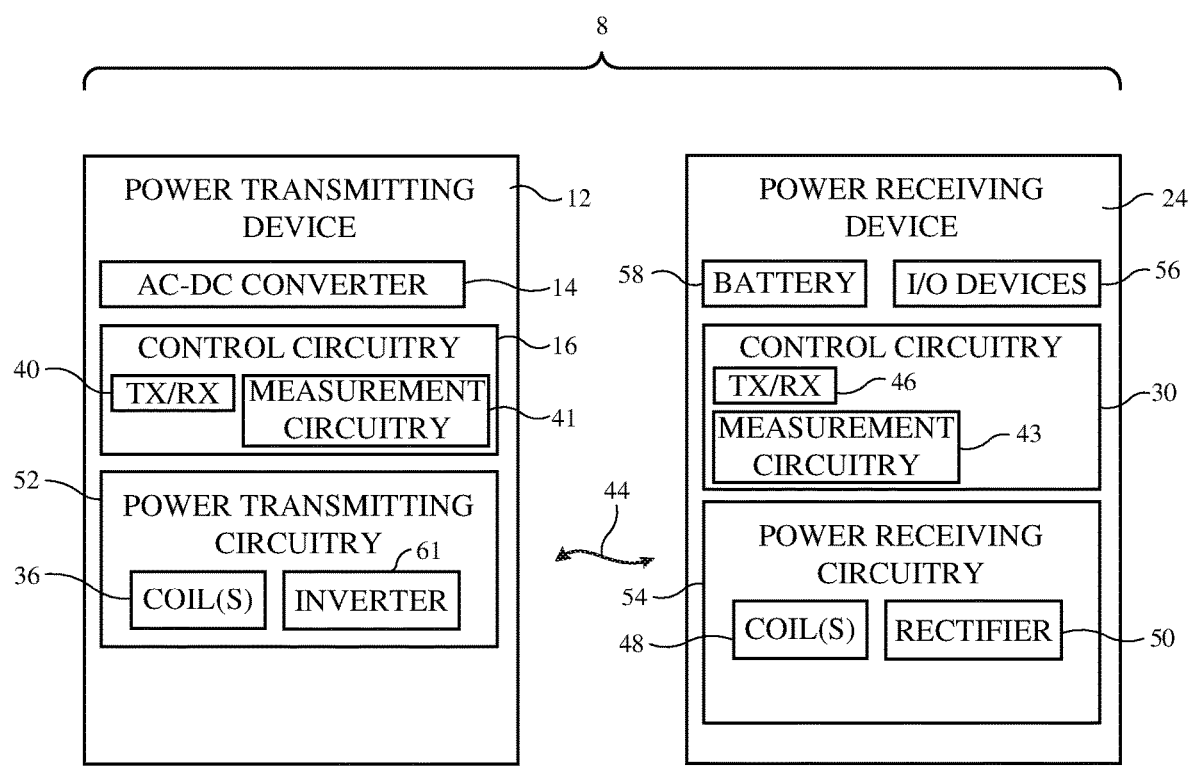
FIG. 1 is a schematic diagram of an illustrative wireless charging system that includes a wireless power transmitting device and a wireless power receiving device in accordance with some embodiments.

An illustrative wireless power system (wireless charging system) is shown in FIG. 1. As shown in FIG. 1, wireless power system 8 includes a wireless power transmitting device such as wireless power transmitting device 12 and includes a wireless power receiving device such as wireless power receiving device 24. Wireless power transmitting device 12 includes control circuitry 16. Wireless power receiving device 24 includes control circuitry 30. Control circuitry in system 8 such as control circuitry 16 and control circuitry 30 is used in controlling the operation of system 8. This control circuitry may include processing circuitry associated with microprocessors, power management units, baseband processors, digital signal processors, microcontrollers, and/or application-specific integrated circuits with processing circuits. The processing circuitry implements desired control and communications features in devices 12 and 24. For example, the processing circuitry may be used in selecting coils, determining power transmission levels, processing sensor data and other data, processing user input, handling negotiations between devices 12 and 24, sending and receiving in-band and out-of-band data, making measurements, and otherwise controlling the operation of system 8.

Control circuitry in system 8 may be configured to perform operations in system 8 using hardware (e.g., dedicated hardware or circuitry), firmware and/or software. Software code for performing operations in system 8 is stored on non-transitory computer readable storage media (e.g., tangible computer readable storage media) in control circuitry 16 and/or 30. The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, or the like. Software stored on the non-transitory computer readable storage media may be executed on the processing circuitry of control circuitry 16 and/or 30. The processing circuitry may include application-specific integrated circuits with processing circuitry, one or more microprocessors, a central processing unit (CPU) or other processing circuitry.

Power transmitting device 12 may be a stand-alone power adapter (e.g., a wireless charging mat or charging puck that includes power adapter circuitry), may be a wireless charging mat or puck that is coupled to a power adapter or other equipment by a cable, may be a portable device, may be equipment that has been incorporated into furniture, a vehicle, or other system, may be a removable battery case, or may be other wireless power transfer equipment. Illustrative configurations in which wireless power transmitting device 12 is a wireless charging mat or wireless charging puck are sometimes described herein as an example.

Power receiving device 24 may be a portable electronic device such as a wristwatch, a cellular telephone, a laptop computer, a tablet computer, an accessory such as an earbud, or other electronic equipment. Power transmitting device 12 may be coupled to a wall outlet (e.g., an alternating current power source), may have a battery for supplying power, and/or may have another source of power. Power transmitting device 12 may have an alternating-current (AC) to direct-current (DC) power converter such as AC-DC power converter 14 for converting AC power from a wall outlet or other power source into DC power. DC power may be used to power control circuitry 16.

During operation, a controller in control circuitry 16 uses power transmitting circuitry 52 to transmit wireless power to power receiving circuitry 54 of device 24. Power transmitting circuitry 52 may have switching circuitry (e.g., inverter circuitry 61 formed from transistors) that is turned on and off based on control signals provided by control circuitry 16 to create AC current signals through one or more wireless power transmitting coils such as transmit coils 36. Coils 36 may be arranged in a planar coil array (e.g., in configurations in which device 12 is a wireless charging mat) or may be arranged to form a cluster of coils (e.g., in configurations in which device 12 is a wireless charging puck). In some arrangements, device 12 may have only a single coil. In other arrangements, a puck or other wireless transmitting device may have two or more coils, three or more coils, four or more coils, or six or more coils.

As the AC currents pass through one or more coils 36, alternating-current electromagnetic (e.g., magnetic) fields (signals 44) are produced that are received by one or more corresponding receiver coils such as coil(s) 48 in power receiving device 24. Device 24 may have a single coil 48, at least two coils 48, at least three coils 48, at least four coils 48, or other suitable number of coils 48. When the alternating-current electromagnetic fields are received by coil(s) 48, corresponding alternating-current currents are induced in coil(s) 48. Rectifier circuitry such as rectifier 50, which contains rectifying components such as synchronous rectification metal-oxide-semiconductor transistors arranged in a bridge network, converts received AC signals (received alternating-current signals associated with electromagnetic signals 44) from coil(s) 48 into DC voltage signals for powering device 24.

The DC voltage produced by rectifier 50 (sometime referred to as rectifier output voltage Vrect) can be used in charging a battery such as battery 58 and can be used in powering other components in device 24. For example, device 24 may include input-output devices 56 such as a display, touch sensor, communications circuits, audio components, sensors, light-emitting diode status indicators, other light-emitting and light detecting components, and other components and these components (which form a load for device 24) may be powered by the DC voltages produced by rectifier 50 (and/or DC voltages produced by battery 58).

Device 12 and/or device 24 may communicate wirelessly using in-band or out-of-band communications. Device 12 may, for example, have wireless transceiver circuitry 40 that wirelessly transmits out-of-band signals to device 24 using an antenna. Wireless transceiver circuitry 40 may be used to wirelessly receive out-of-band signals from device 24 using the antenna. Device 24 may have wireless transceiver circuitry 46 that transmits out-of-band signals to device 12. Receiver circuitry in wireless transceiver 46 may use an antenna to receive out-of-band signals from device 12. In-band transmissions between devices 12 and 24 may be performed using coils 36 and 48. With one illustrative configuration, frequency-shift keying (FSK) is used to convey in-band data from device 12 to device 24 and amplitude-shift keying (ASK) is used to convey in-band data from device 24 to device 12. Power may be conveyed wirelessly from device 12 to device 24 during these FSK and ASK transmissions.

It is desirable for power transmitting device 12 and power receiving device 24 to be able to communicate information such as received power, states of charge, and so forth, to control wireless power transfer. However, the above-described technology need not involve the transmission of personally identifiable information in order to function. Out of an abundance of caution, it is noted that to the extent that any implementation of this charging technology involves the use of personally identifiable information, implementers should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

If desired, control circuitry 16 may include external object measurement circuitry such as external object measurement circuitry 41. External object measurement circuitry 41 is used to detect external objects on the charging surface of device 12 (e.g., on the top of a charging mat or, if desired, to detect objects adjacent to the coupling surface of a charging puck). Circuitry 41 can detect foreign objects such as coils, paper clips, and other metallic objects and can detect the presence of wireless power receiving devices 24 (e.g., circuitry 41 can detect the presence of one or more coils 48). During object detection and characterization operations, external object measurement circuitry 41 can be used to make measurements on coils 36 to determine whether any devices 24 are present on device 12.

In an illustrative arrangement, measurement circuitry 41 of control circuitry 16 contains signal generator circuitry (e.g., oscillator circuitry for generating AC probe signals at one or more probe frequencies, a pulse generator that can create impulses so that impulse responses can be measured to gather inductance information, Q-factor information, etc.) and signal detection circuitry (e.g., filters, analog-to-digital converters, impulse response measurement circuits, etc.). During measurement operations, switching circuitry in device 12 may be adjusted by control circuitry 16 to switch each of coils 36 into use. As each coil 36 is selectively switched into use, control circuitry 16 uses the signal generator circuitry of signal measurement circuitry 41 to apply a probe signal to that coil while using the signal detection circuitry of signal measurement circuitry 41 to measure a corresponding response. Measurement circuitry 43 in control circuitry 30 and/or in control circuitry 16 may also be used in making current and voltage measurements. Measurement circuitry 41 and/or 43 may be omitted if desired.

Figure 2:
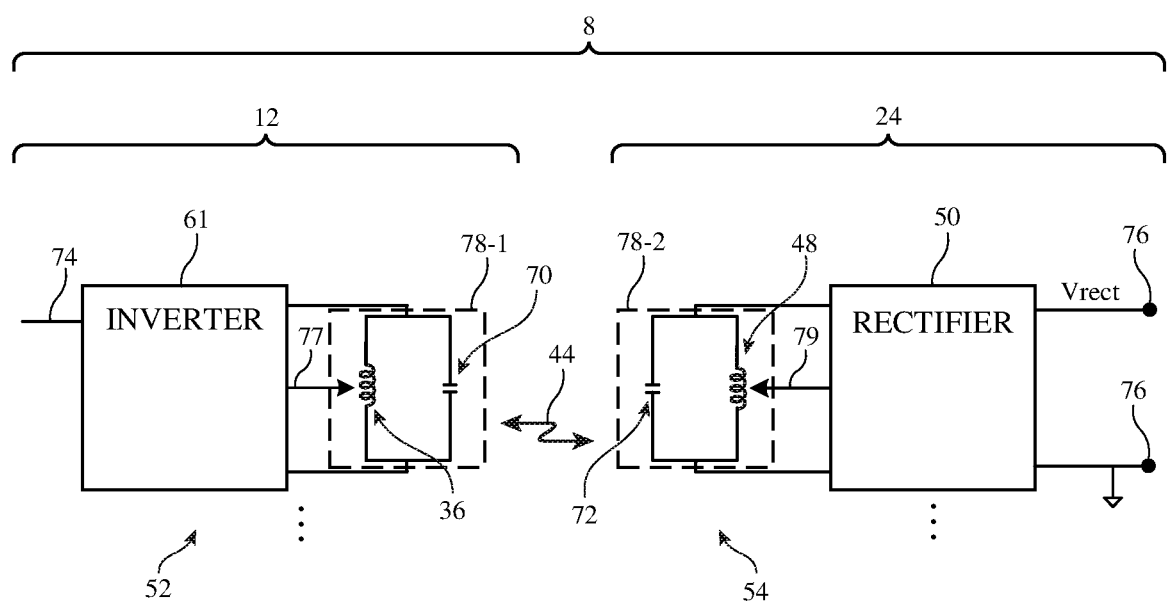
FIG. 2 is a circuit diagram of wireless power transmitting and receiving circuitry in accordance with some embodiments.

FIG. 2 is a circuit diagram of illustrative wireless charging circuitry for system 8. As shown in FIG. 2, circuitry 52 may include inverter circuitry such as one or more inverters 61 or other drive circuitry that produces wireless power signals that are transmitted through an output circuit that includes one or more coils 36 and capacitors such as capacitor 70. In some embodiments, device 12 may include multiple individually controlled inverters 61, each of which supplies drive signals to a respective coil 36. In other embodiments, an inverter 61 is shared between multiple coils 36 using switching circuitry.

During operation, control signals for inverter(s) 61 are provided by control circuitry 16 at control input 74. A single inverter 61 and single coil 36 is shown in the example of FIG. 2, but multiple inverters 61 and multiple coils 36 may be used, if desired. In a multiple coil configuration, switching circuitry can be used to couple a single inverter 61 to multiple coils 36 and/or each coil 36 may be coupled to a respective inverter 61. During wireless power transmission operations, transistors in one or more selected inverters 61 are driven by AC control signals from control circuitry 16. This causes the output circuit formed from selected coil 36 and capacitor 70 to produce alternating-current electromagnetic fields (signals 44) that are received by wireless power receiving circuitry 54 using a wireless power receiving circuit formed from one or more coils 48 and one or more capacitors 72 in device 24. Rectifier circuitry (e.g., one or more rectifiers 50) converts received power from AC to DC and supplies a corresponding direct current output voltage Vrect across rectifier output terminals 76 for powering load circuitry in device 24 (e.g., for charging battery 58, for powering a display and/or other input-output devices 56, and/or for powering other components). A single coil 48 or multiple coils 48 may be included in device 24. In configurations with multiple coils 48, switching circuitry may be used to selectively couple one or more desired coils 48 to a rectifier and/or multiple rectifiers may be used.

In the example of FIG. 2, capacitor 70 and coil 36 are coupled in parallel between a pair of terminals for inverter 61 in device 12. Similarly, capacitor 72 and coil 48 are coupled in parallel between a pair of terminals for rectifier 50 in device 24. In scenarios where inverter 61 has a center tap terminal (e.g., in scenarios where inverter 61 is a push-pull inverter), inverter 61 may have a center tap terminal such as center tap terminal 77 coupled to coil 36. Similarly, in scenarios where rectifier 50 has a center tap terminal, rectifier 50 may have a center tap terminal such as center tap terminal 79 coupled to coil 48.

In one suitable arrangement that is sometimes described herein as an example, coil 36 and capacitor 70 of device 12 are integrated into stacked resonant structures 78-1. Stacked resonant structures 78-1 are self-resonant structures that exhibit both the inductive properties of coil 36 and the capacitive properties of capacitor 70. Similarly, coil 48 and capacitor 72 of device 24 are integrated into stacked resonant structures 78-2. Stacked resonant structures 78-2 are self-resonant structures that exhibit both the inductive properties of coil 48 and the capacitive properties of capacitor 72. Integrating the coils and capacitors into stacked resonant structures may introduce less loss to the system than in scenarios where the capacitors are formed separately from the coils, for example.

Figure 3:
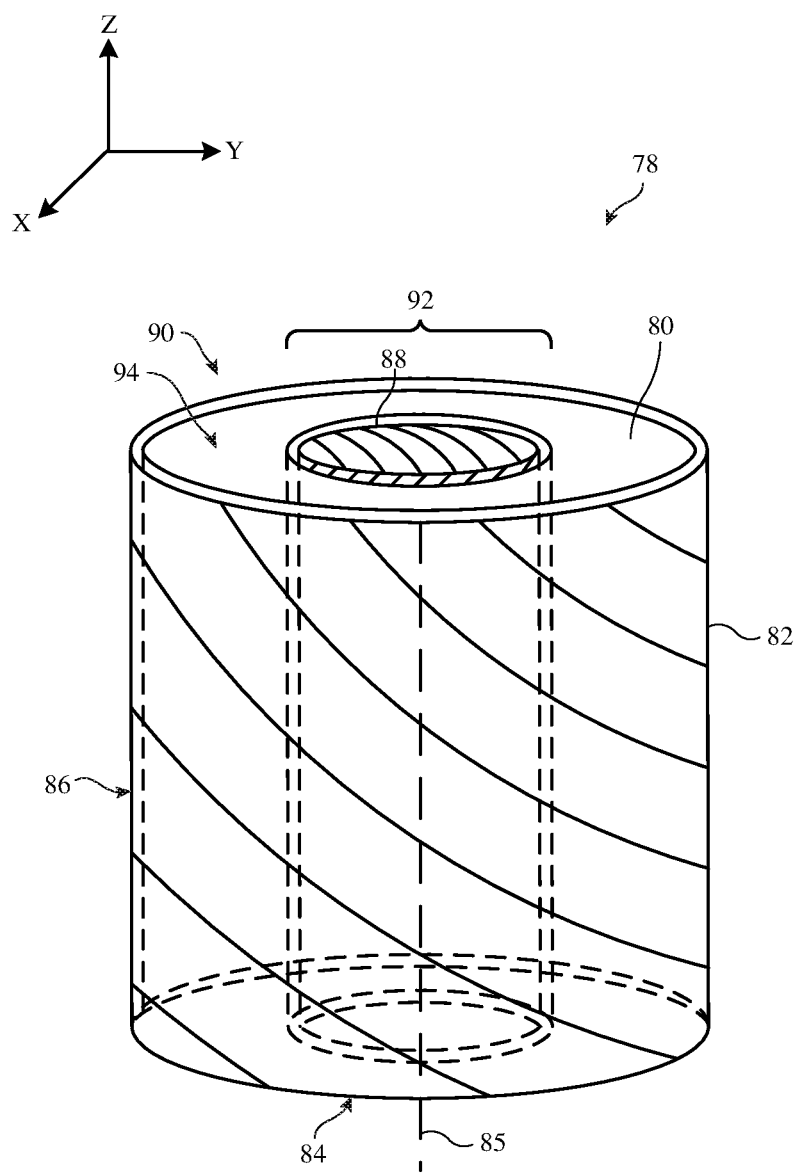
FIG. 3 is a perspective view of illustrative stacked resonant structures that may be used in transmitting or receiving wireless power in accordance with some embodiments.

FIG. 3 is a perspective view of stacked resonant structures 78. Stacked resonator structures 78 of FIG. 3 may be used to form stacked resonant structures 78-1 in device 12 and/or stacked resonant structures 78-2 in device 24 of FIG. 2.

As shown in FIG. 3, stacked resonant structures 78 include a stacked conductor structure such as stacked conductor structure 80 and a magnetic core such as magnetic core 82. Stacked conductor structure 80 includes layers of dielectric material and layers of conductive material (e.g., alternating conductive and dielectric layers). Magnetic core 82 is formed from ferrite or any other desired magnetic material and may therefore sometimes be referred to herein as ferrite core 82. Magnetic core 82 includes a bottom wall 84 and sidewalls 86 extending vertically from bottom wall 84. The top end 90 of magnetic core 82 is left open (e.g., is free from magnetic material), allowing stacked conductor structure 80 to be placed within magnetic core 82 (e.g., within sidewalls 86 such that stacked conductor structure 80 rests on bottom wall 84).

Stacked conductor structure 80 has a central opening 92 and a central axis 85 that runs through central opening 92. In the example of FIG. 3, stacked conductor structure 80 has a cylindrical shape (e.g., laterally extending in a circular path around central axis 85 and central opening 92). This is merely illustrative and, in general, stacked conductor structure 80 (and sidewalls 86 of magnetic core 82) may follow any desired path around central axis 85 and central opening 92 (e.g., a path having any desired number of straight and/or curved segments).

Magnetic core 82 has a central post structure such as central post 88 that extends vertically from bottom wall 84 through opening 92 (e.g., along central axis 85). In other words, central post 88 of magnetic core 82 is inserted into opening 92 when stacked conductor structure 80 is inserted into magnetic core 82. Central post 88 may be solid (e.g., filled with magnetic material such as ferrite such that central axis 85 runs through the magnetic material in central post 88) or may, as shown in the example of FIG. 3, be hollow (e.g., with a cylindrical shape such that central axis 85 does not run through the magnetic material in central post 88). When configured in this way, magnetic core 82 forms a pot core for stacked resonant structures 78 (e.g., a pot core having a cylindrical-shaped groove, where stacked conductor structure 80 is disposed or mounted within the groove). Magnetic core 82 may therefore sometimes be referred to herein as pot core 82.

Stacked conductor structure 80 has a top surface 94 at open end 90 of magnetic core 82. Open end 90 of magnetic core 82 allows external magnetic fields (e.g., magnetic fields associated with signals 44 of FIG. 2) to induce current on the conductive layers of stacked conductor structure 80 (e.g., in scenarios where stacked resonant structures 78 are used to form stacked resonant structures 78-2 in device 24 of FIG. 2) and allows currents driven on the conductive layers of stacked conductor structure 80 to produce magnetic fields associated with signals 44 of FIG. 2 (e.g., in scenarios where stacked resonant structures 78 are used to form stacked resonant structures 78-1 in device 12 of FIG. 2).

The example in which stacked conductor structure 80 is mounted within magnetic core 82 to form stacked resonant structures 78 of FIG. 2 is described herein as an example. This is, however, merely illustrative. Stacked conductor structure 80 need not be used to convey wireless power in a wireless power system such as system 8 of FIGS. 1 and 2. In general, stacked conductor structure 80 may be implemented in any desired system that requires a self-resonant circuit component with a parallel-coupled inductance and capacitance. Similarly, stacked resonant structures 78 (e.g., stacked conductor structure 80 and magnetic core 82) need not be used to convey wireless power and may, in general, be implemented in any desired system that requires a self-resonant circuit component with a parallel-coupled inductance and capacitance (e.g., with parallel-coupled inductive and capacitive characteristics).

Figure 4:
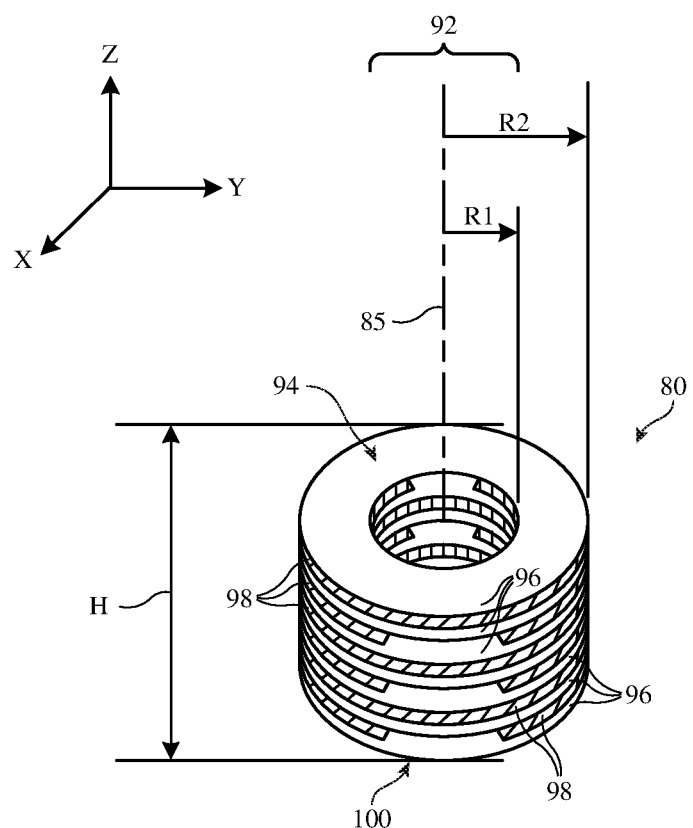
FIG. 4 is a perspective view of an illustrative stacked conductor structure for stacked resonant structures in accordance with some embodiments.

FIG. 4 is a perspective view of stacked conductor structure 80 (shown, e.g., without magnetic core 82 or prior to insertion of stacked conductor structure 80 into magnetic core 82). As shown in FIG. 4, stacked conductor structure 80 includes stacked alternating (interleaved) dielectric layers 96 and conductive layers 98. Dielectric layers 96 are formed from ceramic (e.g., a class-1 dielectric (ceramic) material such as a C0G ceramic, an NP0 ceramic, etc.). Dielectric layers 96 may therefore sometimes be referred to herein as ceramic layers 96. This may, for example, configure dielectric layers 96 to exhibit more stability over a wide range of operating temperatures and voltages and reduces loss relative to scenarios where other materials are used to form dielectric layers 96. Conductive layers 98 are formed from copper, other metals, or other conductive material that is deposited on underlying dielectric layers 96 (e.g., using an ink printing process rather than an etching process).

The top-most dielectric layer 96 in stacked conductor structure 80 defines top surface 94 of stacked conductor structure 80. The bottom-most dielectric layer 96 in stacked conductor structure 80 defines bottom surface 100 of stacked conductor structure 80. Bottom surface 100 may be placed into direct contact with bottom wall 84 of magnetic core 82 in stacked resonant structures 78 (FIG. 3) or, if desired, a spacer may be interposed between bottom surface 100 and bottom wall 84 of magnetic core 82. In scenarios where a drive printed circuit board is used to drive stacked resonant structures 78, the drive printed circuit board is interposed between bottom surface 100 and bottom wall 84. The stack-up of conductive layers 98 and dielectric layers 96 in stacked conductor structure 80 configures stacked conductor structure 80 to exhibit a total height H. Conductive layers 98 and dielectric layers 96 each have a respective opening 92 aligned with central axis 85. Conductive layers 98 and dielectric layers 96 have an inner radius R1 that defines opening 92 and an outer radius R2 that defines the overall radius of stacked conductor structure 80. Height H, inner radius R1, and outer radius R2 may be any suitable values and may, for example, be selected to meet physical space constraints for stacked resonator structures 78 within devices 12 and 24 of FIG. 1.

Figure 5:
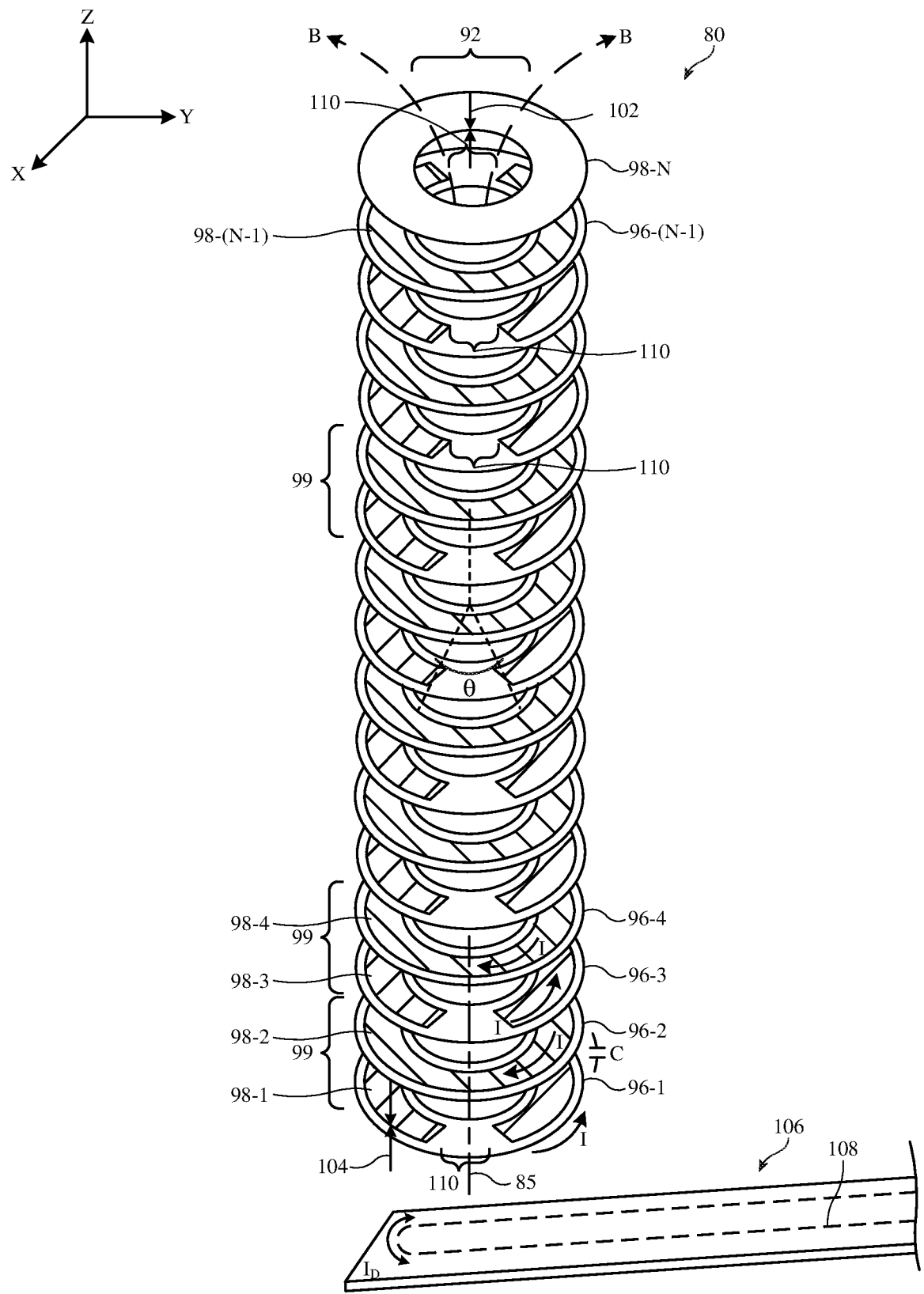
FIG. 5 is an exploded perspective view of an illustrative stacked conductor structure in accordance with some embodiments.

FIG. 5 shows an exploded view of the dielectric and conductive layers in stacked conductor structure 80. As shown in FIG. 5, stacked conductor structure 80 has N dielectric layers 96 (e.g., a first dielectric layer 96-1, a second dielectric layer 96-2, a third dielectric layer 96-4, an (N−1)th dielectric layer 96-(N−1), an Nth dielectric layer 96-N, etc.). Conductive layers 98 may be printed on any desired number of the N dielectric layers 96 (e.g., a subset of the dielectric layers 96 or all of the dielectric layers 96 in stacked conductor structure 80). In the example of FIG. 5, there are (N−1) conductive layers 98 patterned onto (N−1) respective dielectric layers 96 (e.g., a first conductive layer 98-1 patterned on dielectric layer 96-1, a second conductive layer 98-2 patterned on dielectric layer 96-2, a third conductive layer 98-3 patterned on dielectric layer 96-3, a fourth conductive layer 98-4 patterned on dielectric layer 96-4, an (N−1)th conductive layer 98-(N−1) patterned on dielectric layer 96-(N−1), etc.). In this way, stacked dielectric layers 96 and conductive layers 98 may form a multi-layer ceramic capacitor (MLCC) type stack up in stacked conductor structure 80. Each conductive layer 98 in stacked conductor structure 80 adds more total capacitance (e.g., series capacitance) to stacked conductor structure 80.

Each conductive layer 98 in stacked conductor structure 80 includes an opening 110 about central axis 85 (e.g., about central post 88) that configures the conductive layer 98 to exhibit a "C" or "U" shape within the X-Y plane. Each conductive layer 98 is oriented at an antiparallel (180 degree) angle about central axis 85 relative to the one or two conductive layers 98 adjacent (e.g., immediately above and/or below) that conductive layer. In the example of FIG. 5, the odd-numbered conductive layers 98 have openings 110 facing in the +X direction whereas the even-numbered conductive layers 98 have openings 110 facing in the −X direction.

Openings 110 have a width given by angle θ in the X-Y plane about central axis 85. Angle θ may be 10-30 degrees, 5-45 degrees, 20-50 degrees, 30-60 degrees, 10-60 degrees, 10-90 degrees, 20-120 degrees, less than 150 degrees, less than 120 degrees, less than 90 degrees, less than 60 degrees, less than 45 degrees, or other values. Conductive layers 98 have thickness 104 (in the Z-direction). Thickness 104 may, for example, be chosen to be much less than the skin depth of the conductive material used to form conductive layers 98 at the operating frequency of stacked conductor structure 80.

The lateral distance from central axis 85 to the outer edge (circumference) of conductive layers 98 is less than radius R2 of FIG. 4 whereas the lateral distance from central axis 85 to the inner edge of conductive layers 98 is greater than radius R1 of FIG. 4. Dielectric layers 96 have thickness 102 (in the Z-direction). If desired, the uppermost dielectric layer 96 (e.g., dielectric layer 96-N) and/or the bottom-most dielectric layer 96 (e.g., dielectric layer 96-1) may be thicker than the other dielectric layers 96 in stacked conductor structure 80. The number (N−1) of conductive layers 98, thickness 102, thickness 104, and/or angle θ may be selected to achieve a desired capacitance within stacked conductor structure 80, to optimize the effective series resistance (ESR) of stacked conductor structure 80 at the operating frequency of stacked conductor structure 80, and/or to withstand the operating voltage of stacked conductor structure 80.

Stacked conductor structure 80 is driven by driving structures such as driving structures 106. Driving structures 106 include drive traces 108. Drive traces 108 are coupled to the terminals of host circuitry. The host circuitry may include inverter 61 in scenarios where stacked conductor structure 80 is used to form stacked resonant structures 78-1 in device 12. The host circuitry may include rectifier 50 in scenarios where stacked conductor structure 80 is used to form stacked resonant structures 78-2 in device 24 of FIG. 2.

When stacked conductor structure 80 is driven by driving structures 106 (e.g., to produce signals 44 of FIG. 2), drive current $I_D$ is provided on drive traces 108 (e.g., by the host circuitry). Drive current $I_D$ follows a loop path on drive traces 108 to produce a magnetic field (e.g., magnetic field B) extending vertically through opening 92. Pairs 99 of adjacent conductive layers 98 each include one odd-numbered conductive layer 98 and an immediately adjacent even-numbered conductive layer 98 (e.g., a first pair 99 includes conductive layers 98-1 and 98-2, a second pair 99 includes conductive layers 98-3 and 98-4, etc.). While each conductive layer 98 is C-shaped and includes an opening 110, because of the alternating orientation of conductive layers 98, each pair 99 collectively includes an entire loop of conductive material (e.g., in a projection onto the X-Y plane) running around central axis 85.

The magnetic field produced by drive current $I_D$ produces current I on conductive layers 98. Within each pair 99, the current I on the lower conductive layer 98 in that pair produces a displacement current through the intervening dielectric layer 96 that induces corresponding current I on the upper conductive layer 98 in that pair (e.g., from conductive layer 98-1 to conductive layer 98-2 through intervening dielectric layer 96-2 in the lower-most pair 99 of stacked conductor structure 80, from conductive layer 98-3 to conductive layer 98-4 through intervening dielectric layer 96-5 in the second lower-most pair 99 of stacked conductor structure 80, etc.). This configures the current I in each pair 99 to follow a complete loop path around central axis 85, such that the conductive layers 98 in each pair 99 effectively acts as one turn of inductance around central axis 85 (e.g., to establish the inductance of coils 36 or 48 of FIG. 2 for stacked resonant structures 78). This process operates in reverse when stacked conductor structure 80 receives signals 44 of FIG. 2 (e.g., when drive traces 108 are coupled to rectifier 50 of FIG. 2). At the same time, each pair 99 of conductive layers 98 contributes a series capacitance (e.g., a capacitance of C/2 when each pair exhibits a capacitance C) to stacked conductor structure 80 (e.g., to establish the capacitance of capacitors 70 and 72 of FIG. 2 for stacked resonant structures 78).

The resonant frequency of stacked conductor structure 80 (and thus stacked resonant structures 78 of FIG. 3) is given by the inductance of one complete turn of conductive material around central axis 85 (e.g., is determined by one pair 99 of conductive layers 98). At the same time, the total capacitance of stacked conductor structure 80 is scaled up (without affecting the inductance) as more pairs 99 of conductive layers 98 are added to the stack. In this way, stacked conductor structure 80 exhibits a self-resonance and a parallel-coupled capacitance and inductance between conductive traces 108, and configures stacked conductor structure 80 to introduce less loss to the system than in scenarios where separate (non-integrated) parallel-coupled capacitors and inductors are used.

Figure 6:
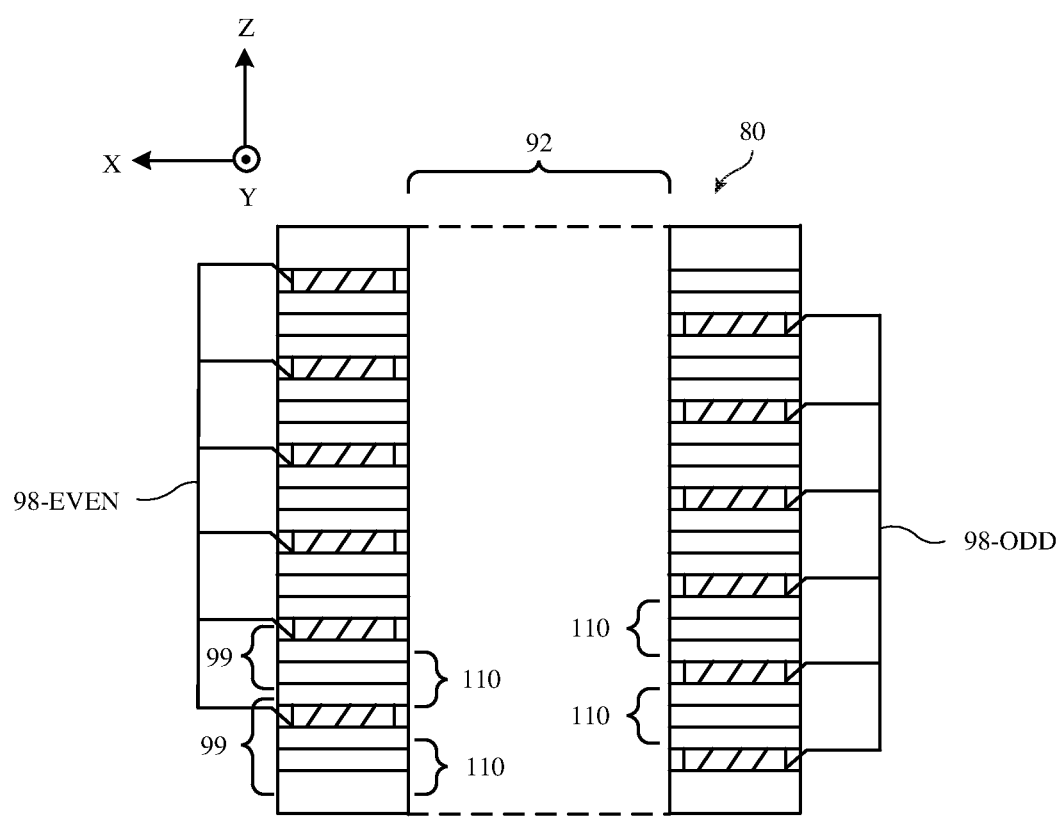
FIG. 6 is a cross sectional side view of an illustrative stacked conductor structure in accordance with some embodiments.

FIG. 6 is a cross-sectional side view of stacked conductor structure 80. As shown in FIG. 6, each pair 99 of conductive layers 98 includes a corresponding odd-numbered conductive layer 98-ODD (e.g., conductive layers 98-1, 98-3, etc. in FIG. 5) and a corresponding even-numbered conductive layer 98-EVEN (e.g., conductive layers 98-2, 98-4, etc. in FIG. 5). Odd-numbered conductive layers 98-ODD have openings 110 on a first (e.g., left) side of opening 92 whereas even-numbered conductive layers 98-EVEN have openings 110 on a second (e.g., right) side of opening 92. Collectively, each pair 99 of conductive layers 98 has conductive material following an entire loop path around opening 92 when viewed in the vertical direction.

Figure 7:
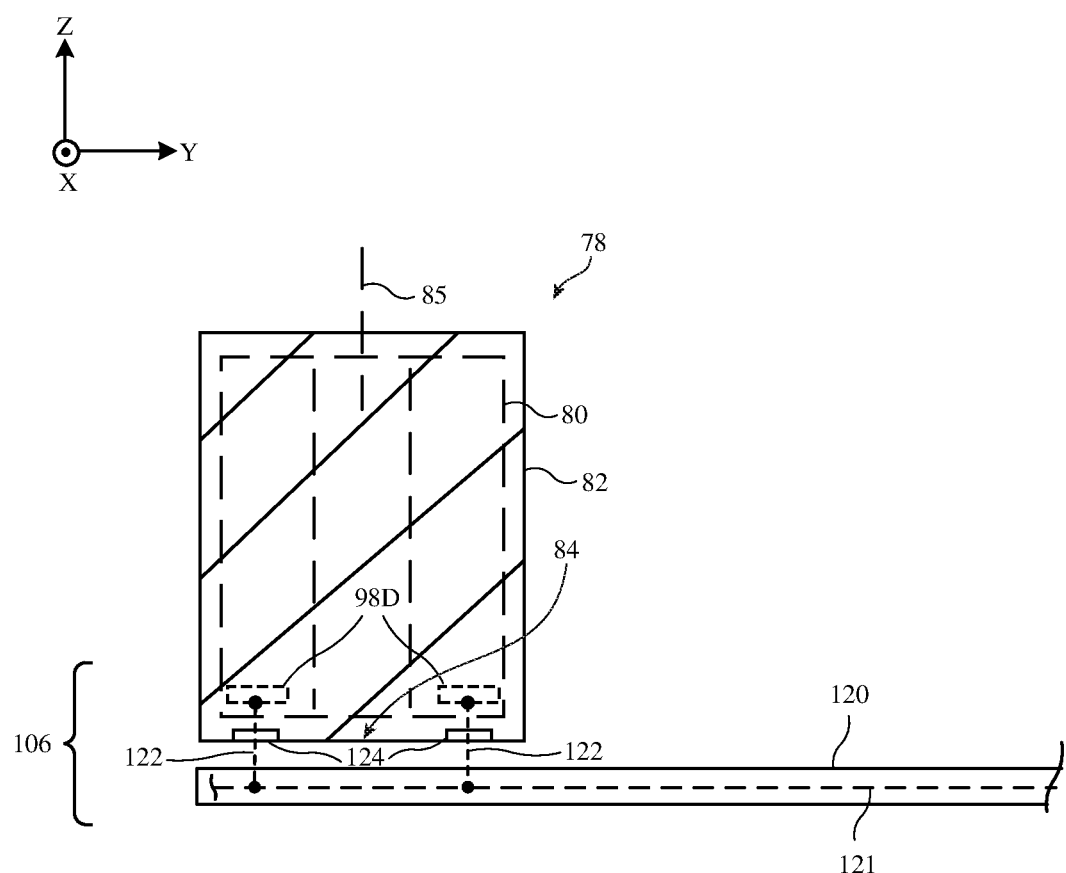
FIG. 7 is a side view of illustrative stacked resonant structures having a stacked conductor structure with a drive layer that drives the stacked resonant structures in accordance with some embodiments.

Driving structures 106 of FIG. 5 may include a drive layer integrated within stacked conductor structure 80 or a drive printed circuit board mounted under stacked conductor structure 80 (and at least partially located within magnetic core 82 of FIG. 3). FIG. 7 is a side view showing how stacked resonant structures 78 may be fed (driven) using driving structures 106 that include a drive layer integrated within stacked conductor structure 80.

As shown in FIG. 7, driving structures 106 include a substrate such as substrate 120, conductive interconnect structures such as conductive interconnect structures 122, and drive traces 98D. Substrate 120 may be a flexible printed circuit, a rigid printed circuit board, or other substrate. Conductive traces 121 are patterned on substrate 120. Conductive traces 121 may be coupled to the terminals of host circuitry such as inverter 61 or rectifier 50 of FIG. 2.

Conductive interconnect structures 122 couple conductive traces 121 to drive traces 98D. Drive traces 98D are formed from any desired conductive layer 98 in stacked conductor structure 80. As an example, drive traces 98D may be formed from the lower-most conductive layer 98-1 in stacked conductor structure 80 (FIG. 5). There may be at least two conductive interconnect structures 122 that respectively couple conductive traces 121 to first and second locations on drive traces 98D (e.g., so that a loop path is provided for the drive current on the drive traces). Conductive interconnect structures 122 extend through respective holes or openings 124 in magnetic core 82 (e.g., holes or openings formed in bottom wall 84 of magnetic core 82). Examples in which conductive interconnect structures 122 include conductive contact pads or conductive pins are described herein as examples. This is merely illustrative and, in general, conductive interconnect structures 122 may include conductive contact pads, conductive pins, conductive wire, solder, welds, conductive springs, conductive brackets, conductive adhesive, conductive foam, conductive traces, metal foil, sheet metal, and/or any other desired conductive interconnect structures for coupling conductive traces 121 to drive traces 98D. Conductive traces 121, conductive interconnect structures 122, and drive traces 98D collectively form drive traces 108 (FIG. 5) for driving structures 106. Current driven on conductive traces 121 (e.g., current $I_D$ of FIG. 5) also flows through conductive interconnect structures 122 and drive traces 98D to drive stacked resonant structures 78 (e.g., to produce signals 44 of FIG. 2).

Figure 8:
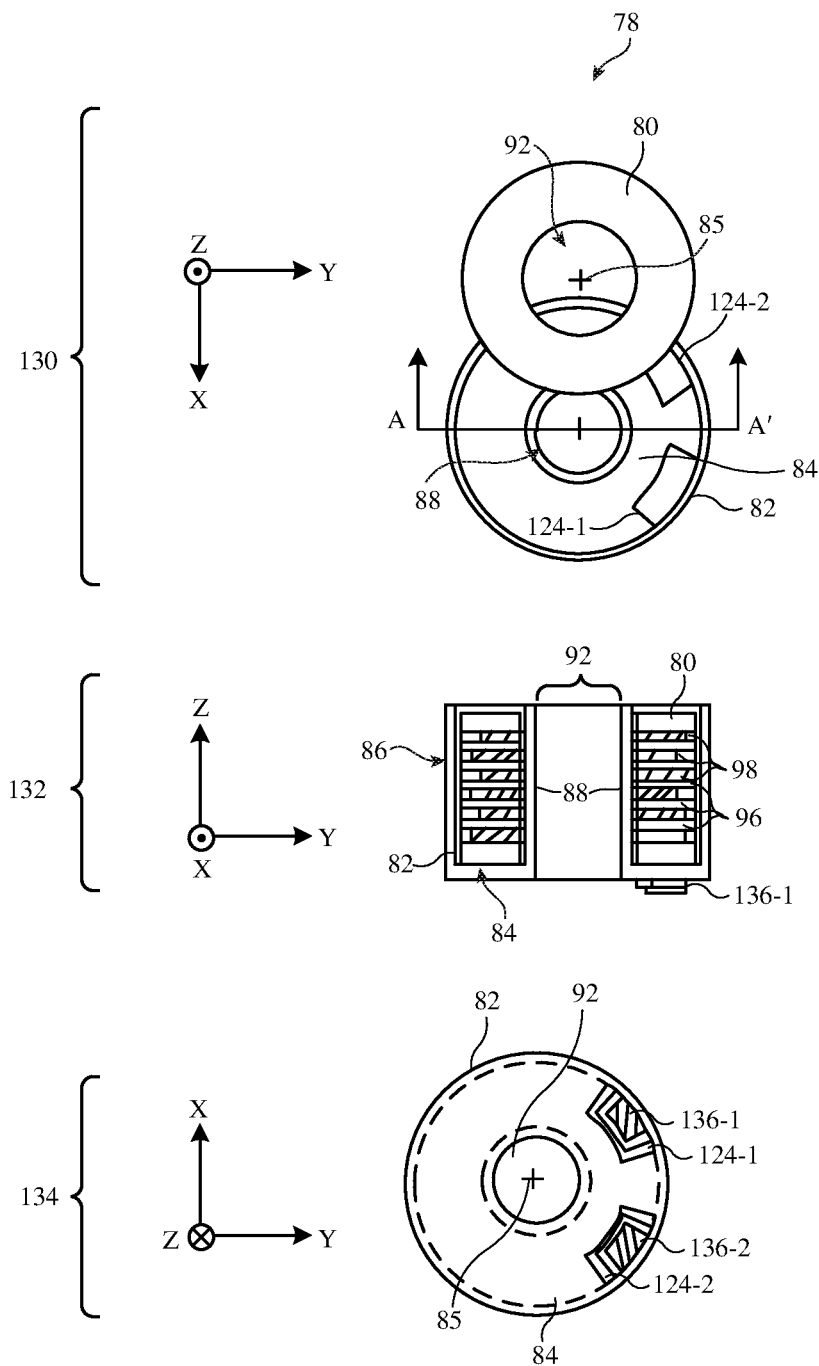
FIG. 8 is a top view, cross-sectional side view, and bottom view of illustrative stacked resonant structures that are driven by a drive layer having a pair of contact pads in accordance with some embodiments.

FIG. 8 is a diagram showing how stacked conductor structure 80 is mounted within stacked resonant structures 78 in an example where conductive interconnect structures 122 include a pair of conductive contact pads. FIG. 8 depicts a top view 130 of stacked resonant structures 78 with stacked conductor structure 80 removed, a cross-sectional side view 132 of stacked resonant structures 78 (e.g., as taken along line AA' of top view 130), and a bottom view 134 of stacked resonant structures 78.

As shown in top view 130 of FIG. 8, bottom (rear) wall 84 of magnetic core 82 has a first opening 124-1 and a second opening 124-2. Central post 88 of magnetic core 82 is inserted into opening 92 and stacked conductor structure 80 is mounted to bottom wall 84 of magnetic core 82 to form stacked resonant structures 78.

As shown in cross-sectional side view 132, stacked conductor structure 80 is mounted to bottom wall 84 of magnetic core 82. Stacked conductor structure 80 is laterally interposed between central post 88 and sidewalls 86 of magnetic core 82. Stacked conductor structure 80 includes alternating conductive layers 98 and dielectric layers 96. One of the conductive layers 98 (e.g., the bottom-most conductive layer 98) forms drive traces 98D of FIG. 7. The conductive layer 98 that forms drive traces 98D is coupled to conductive contact pads 136-1 and 136-2. Contact pads 136-1 and 136-2 form at least part of conductive interconnect structures 122 of FIG. 7.

As shown in bottom view 134, opening 124-1 in bottom wall 84 of magnetic core 82 is aligned with contact pad 136-1 of stacked conductor structure 80. Opening 124-2 in bottom wall 84 of magnetic core 82 is aligned with contact pad 136-2 of stacked conductor structure 80. Contact pads 136 are patterned on respective dielectric legs of stacked conductor structure 80 that protrude through openings 124. Contact pads 136 are soldered or otherwise electrically coupled to conductive traces 121 on substrate 120 of FIG. 7.

Figure 9:
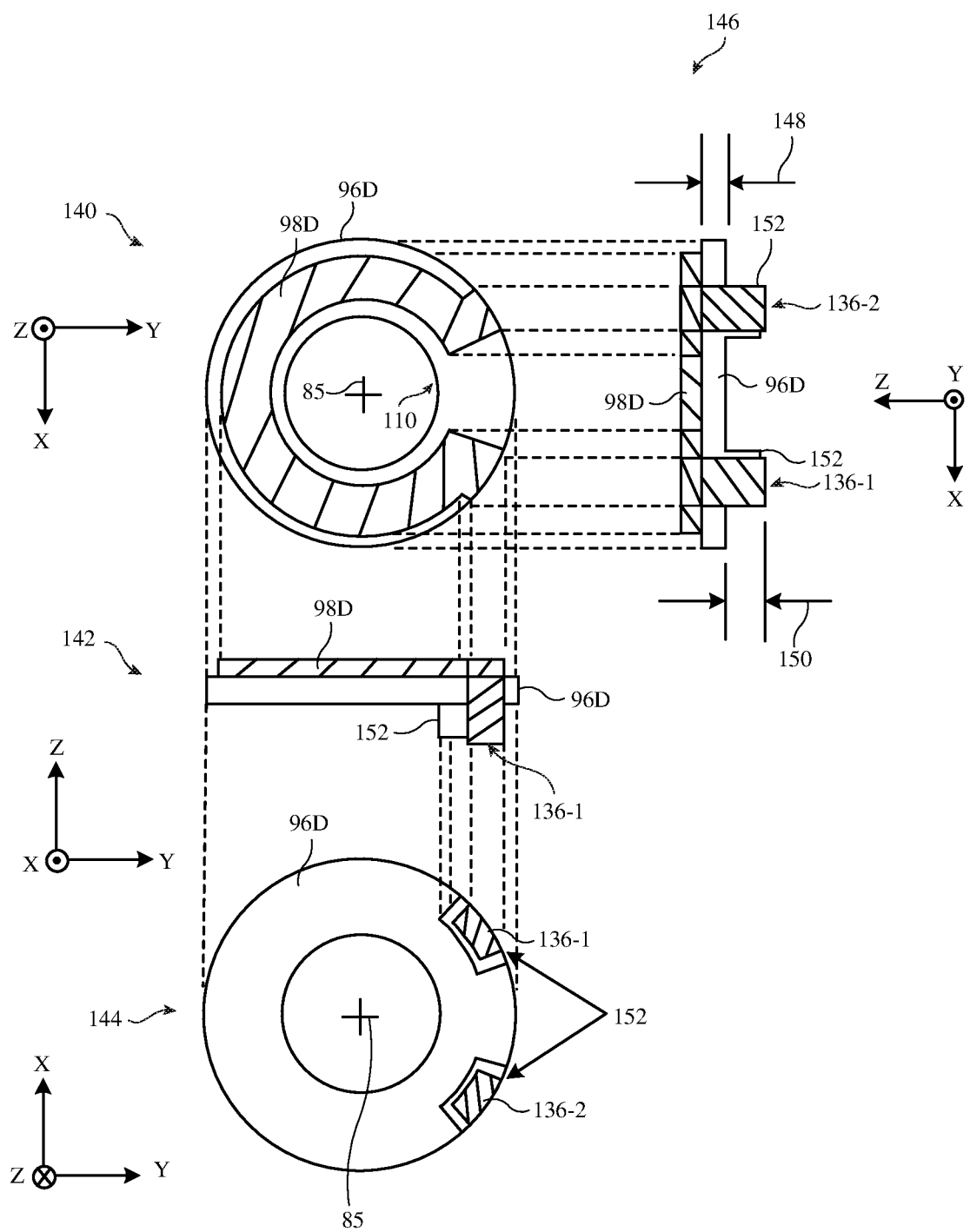
FIG. 9 is a top view, side views, and bottom view of an illustrative drive layer having a pair of contact pads in accordance with some embodiments.

FIG. 9 is a diagram of drive traces 98D in stacked conductor structure 80 in the example where conductive interconnect structures 122 include a pair of contact pads (e.g., with the remaining layers of stacked conductor structure 80 removed for the sake of clarity). FIG. 9 depicts a top view 140 of drive traces 98D, side views 142 and 146 of drive traces 98D, and a bottom view 144 showing contact pads 136-1 and 136-2 for drive traces 98D.

As shown in top view 140, drive traces 98D (e.g., conductive layer 98-1 of FIG. 5 in scenarios where the lower-most conductive layer 98 is used to form drive traces 98D) are patterned on an underlying dielectric layer 96D (e.g., dielectric layer 96-1 of FIG. 5 in scenarios where the lower-most conductive layer 98 is used to form drive traces 98D). Dielectric layer 96D may sometimes be referred to herein as dielectric drive layer 96D. Dielectric drive layer 96D and drive traces 98D may sometimes be referred to herein collectively as forming the "drive layer" of stacked conductor structure 80 and thus stacked resonant structures 78. Drive traces 98D may extend substantially around central axis 85 and include opening 110 that prevents the drive traces from forming a full loop around central axis 85.

As shown in side views 142 and 146, dielectric drive layer 96D has dielectric legs 152 extending vertically away from drive traces 98D. Contact pads 136-1 and 136-2 are patterned on the bottom surface of respective legs 152. Legs 152 have length 150 that is sufficiently long so as to allow legs 152 to protrude through openings 124-1 and 124-2 of magnetic core 82 (FIG. 8). Conductive traces are patterned on the side surfaces of legs 152 to couple drive traces 98D to contact pads 136-1 and 136-2. Dielectric drive layer 96D has a thickness 148 that may, if desired, be thicker than the thickness 102 (FIG. 5) of the other dielectric layers 96 in stacked conductor structure 80.

As shown in bottom view 144, contact pads 136-1 and 136-2 are patterned on the bottom surface of respective legs 152. Contact pads 136-1 and 136-2 may be surface mount contact pads (e.g., reflow-solderable pads) that are soldered and electrically connected to conductive traces 121 of FIG. 7.

Figure 10:
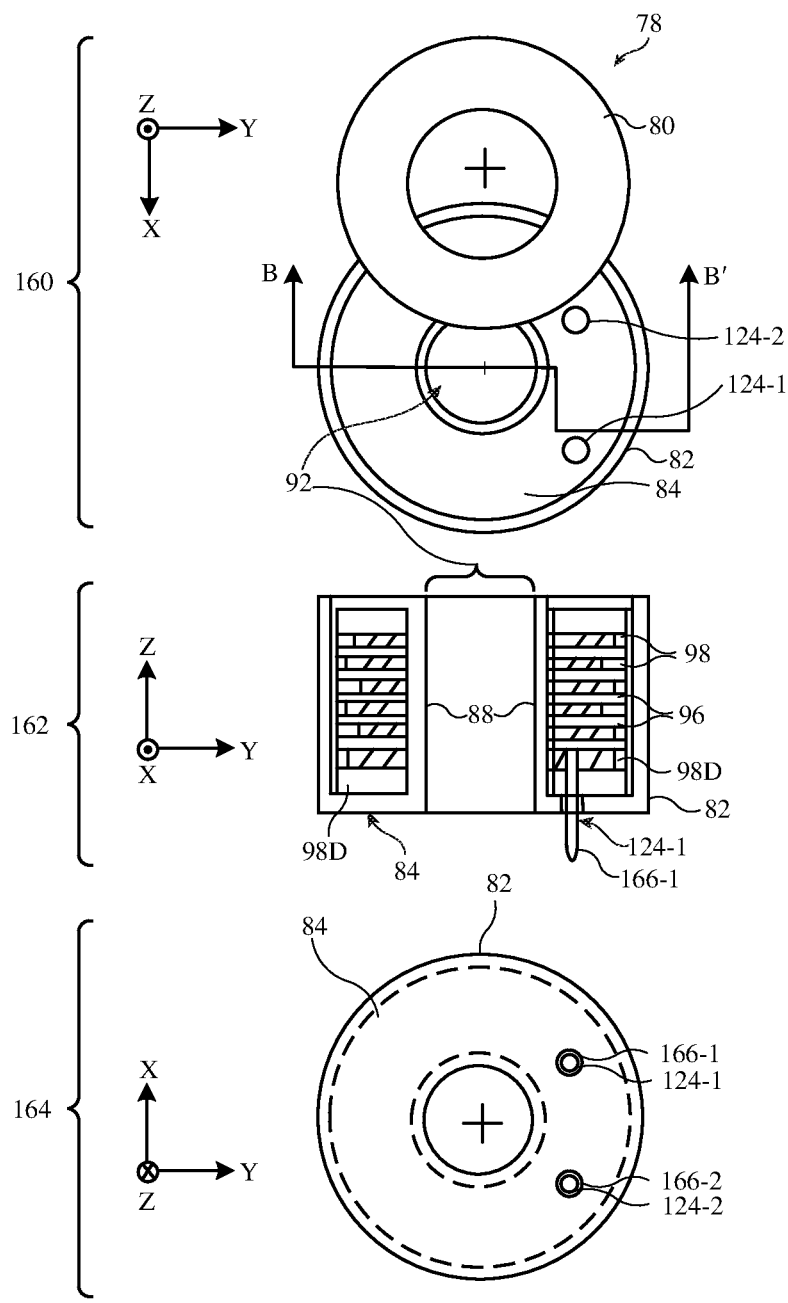
FIG. 10 is a top view, cross-sectional side view, and bottom view of illustrative stacked resonant structures that are driven by a drive layer having a pair of contact pins in accordance with some embodiments.

The example of FIGS. 8 and 9 in which drive traces 98D are driven (fed) using a pair of contact pads 136 is merely illustrative. In another suitable arrangement, drive traces 98D may be driven using a pair of conductive pins. FIG. 10 is a diagram showing how stacked conductor structure 80 is mounted within stacked resonant structures 78 in an example where conductive interconnect structures 122 (FIG. 7) include a pair of conductive pins. FIG. 10 depicts a top view 160 of stacked resonant structures 78 with stacked conductor structure 80 removed, a cross-sectional side view 162 of stacked resonant structures 78 (e.g., as taken along line BB' of top view 160), and a bottom view 164 of stacked resonant structures 78.

As shown in top view 160 of FIG. 10, bottom wall 84 of magnetic core 82 has a first opening 124-1 and a second opening 124-2. Central post 88 of magnetic core 82 is inserted into opening 92 and stacked conductor structure 80 is mounted to bottom wall 84 of magnetic core 82 to form stacked resonant structures 78.

As shown in cross-sectional side view 162, stacked conductor structure 80 is mounted to bottom wall 84 of magnetic core 82. Stacked conductor structure 80 is laterally interposed between central post 88 and sidewalls 86 of magnetic core 82. Stacked conductor structure 80 includes alternating conductive layers 98 and dielectric layers 96. One of the conductive layers 98 (e.g., the bottom-most conductive layer 98) forms drive traces 98D of FIG. 7. The conductive layer 98 that forms drive traces 98D is coupled to conductive pins 166-1 and 166-2. Conductive pins 166-1 and 166-2 form part of conductive interconnect structures 122 of FIG. 7.

As shown in bottom view 164, opening 124-1 in bottom wall 84 of magnetic core 82 is aligned with conductive pin 166-1 of stacked conductor structure 80. Opening 124-2 in bottom wall 84 of magnetic core 82 is aligned with conductive pin 166-2 of stacked conductor structure 80. Conductive pins 166 protrude vertically through openings 124. Conductive pins 166 are pressed against conductive traces 121 on substrate 120 of FIG. 7. Conductive pins 166 may be soldered or otherwise affixed to conductive traces 121.

Figure 11:
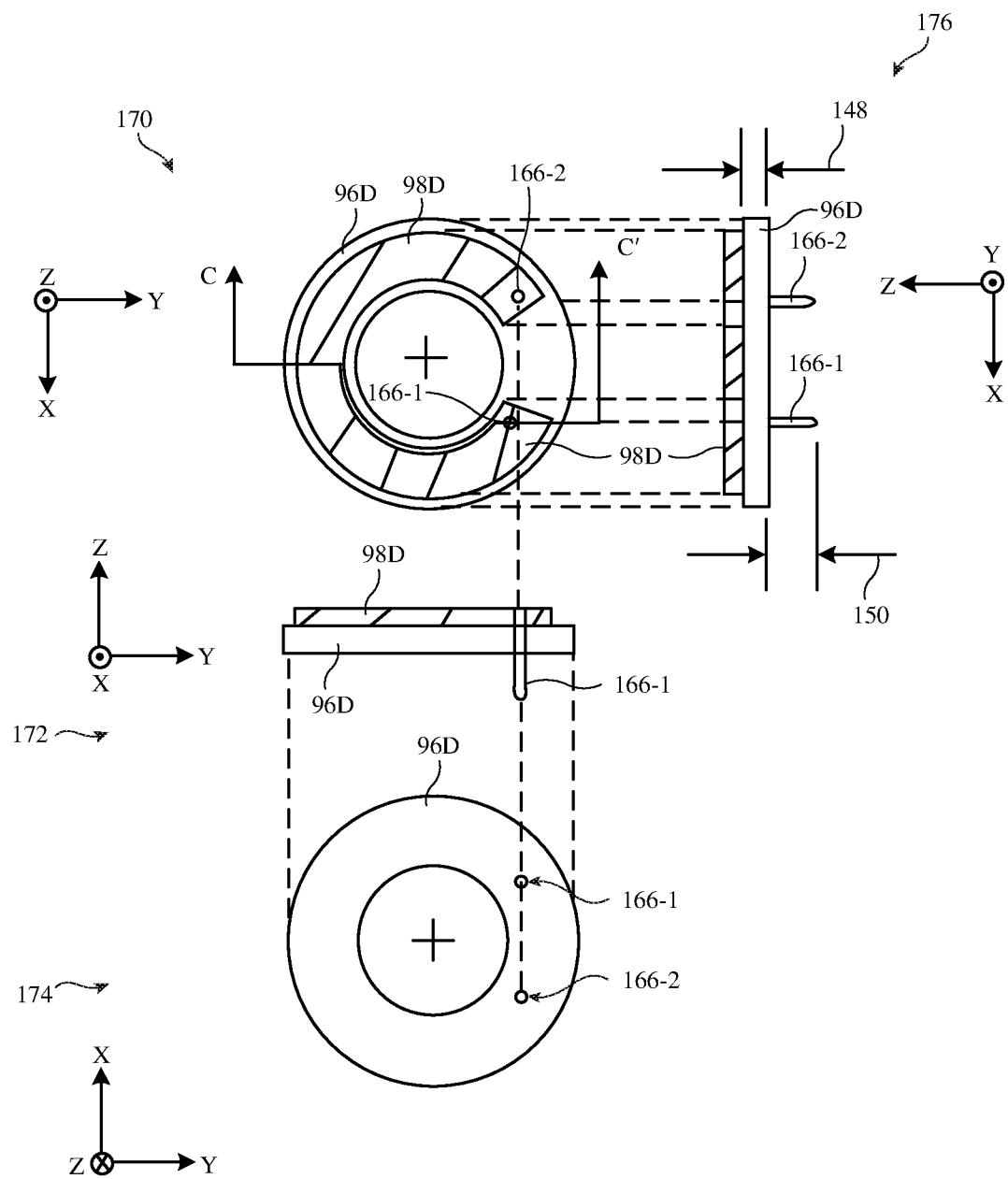
FIG. 11 is a top view, side view, cross-sectional side view, and bottom view of an illustrative drive layer having a pair of contact pins in accordance with some embodiments.

FIG. 11 is a diagram of drive traces 98D in stacked conductor structure 80 in the example where conductive interconnect structures 122 include a pair of conductive pins (e.g., with the remaining layers of stacked conductor structure 80 removed for the sake of clarity). FIG. 11 depicts a top view 170 of drive traces 98D, cross-sectional side view 172 and side view 176 of drive traces 98D, and a bottom view 174 showing conductive pins 166-1 and 166-2 for drive traces 98D.

As shown in top view 170, drive traces 98D are patterned on the top surface of an underlying dielectric drive layer 96D. As shown in cross-sectional side view 172 (e.g., as taken along line CC' of top view 170) and side view 176, conductive pins 166-1 and 166-2 may extend from drive traces 98D through dielectric drive layer 96D (e.g., through holes in dielectric drive layer 96D) or may extend from the bottom surface of dielectric drive layer 96D (e.g., conductive through vias in dielectric drive layer 96D may couple drive traces 98D to the conductive pins in this scenario). Conductive pins 166-1 and 166-2 may have a length 150 that is sufficiently long so as to allow conductive pins 166-1 and 166-2 to protrude through openings 124-1 and 124-2 of magnetic core 82 (FIG. 10).

The examples of FIGS. 8-11 in which a pair of conductive interconnect structures 122 (e.g., two contact pads 136 or two conductive pins 166) are used to drive the drive traces 98D in stacked resonant structures 78 are merely illustrative. In another suitable arrangement, three conductive interconnect structures 122 may be used to drive the drive traces 98D in stacked resonant structures 78. The third conductive interconnect structure may be coupled to a third terminal of the host circuitry (e.g., a third terminal of inverter 61 or rectifier 50 of FIG. 2). For example, in scenarios where inverter 61 includes center tap terminal 77 or rectifier 50 includes center tap terminal 79 of FIG. 2, the third conductive interconnect structure may couple drive traces 98D to the center tap terminal.

Figure 12:
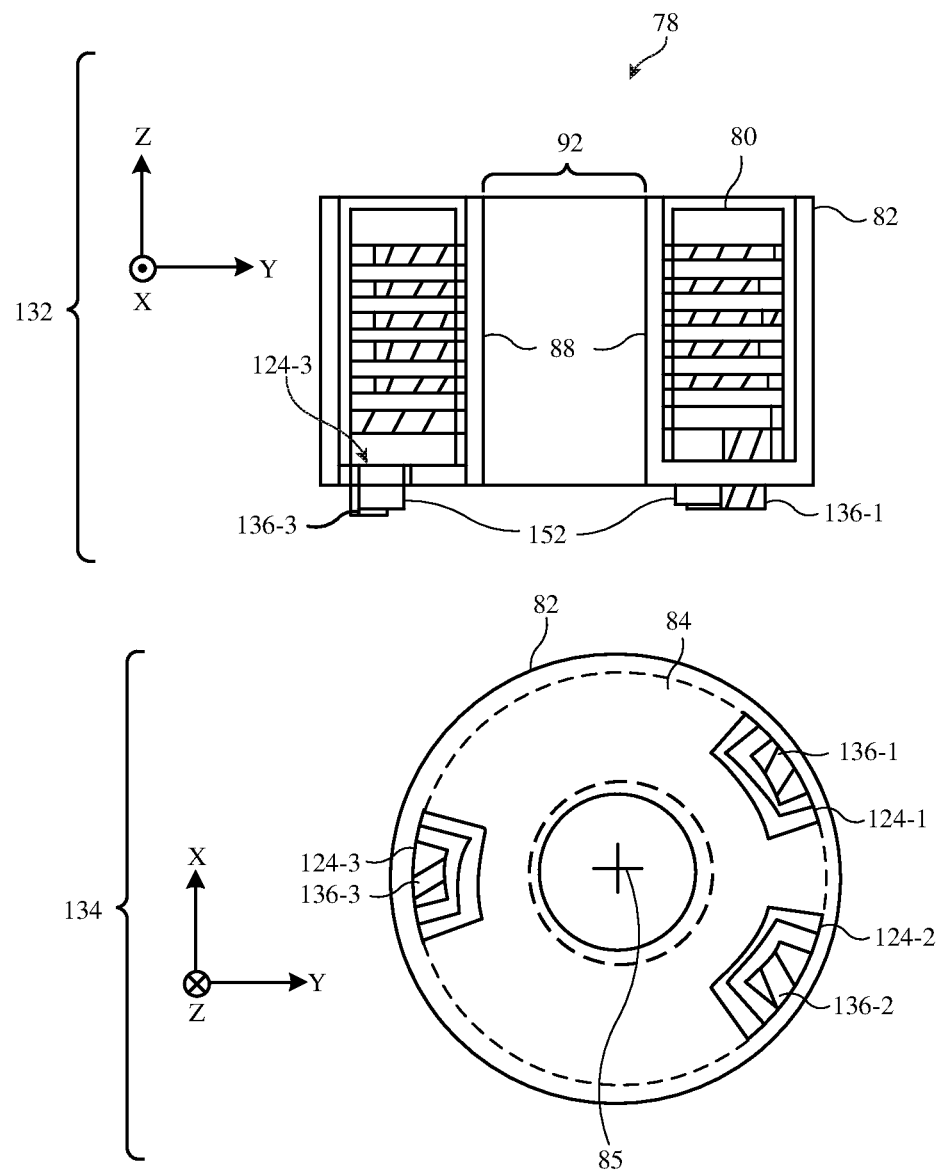
FIG. 12 is a cross-sectional side view and bottom view of illustrative stacked resonant structures that are driven by a drive layer having three contact pads in accordance with some embodiments.

FIG. 12 is a diagram showing how stacked conductor structure 80 is mounted within stacked resonant structures 78 in an example where conductive interconnect structures 122 include three conductive contact pads.

As shown in bottom view 134 of FIG. 12, bottom wall 84 of magnetic core 82 includes a third opening 124-3. Third opening 124-3 is shown on a side of central axis 85 opposite to openings 124-1 and 124-2 in FIG. 12. This is merely illustrative and, in general, third opening 124-3 may be at any desired location on bottom wall 84 (e.g., interposed between openings 124-1 and 124-2, located at the same side of central axis 85 as openings 124-1 and 124-2, etc.). Stacked conductor structure 80 includes a third contact pad 136-3 aligned with third opening 124-3. As shown in cross-sectional side view 132 of FIG. 12, third contact pad 136-3 is formed on the bottom surface of a corresponding leg 152 that protrudes through opening 124-3.

Figure 13:
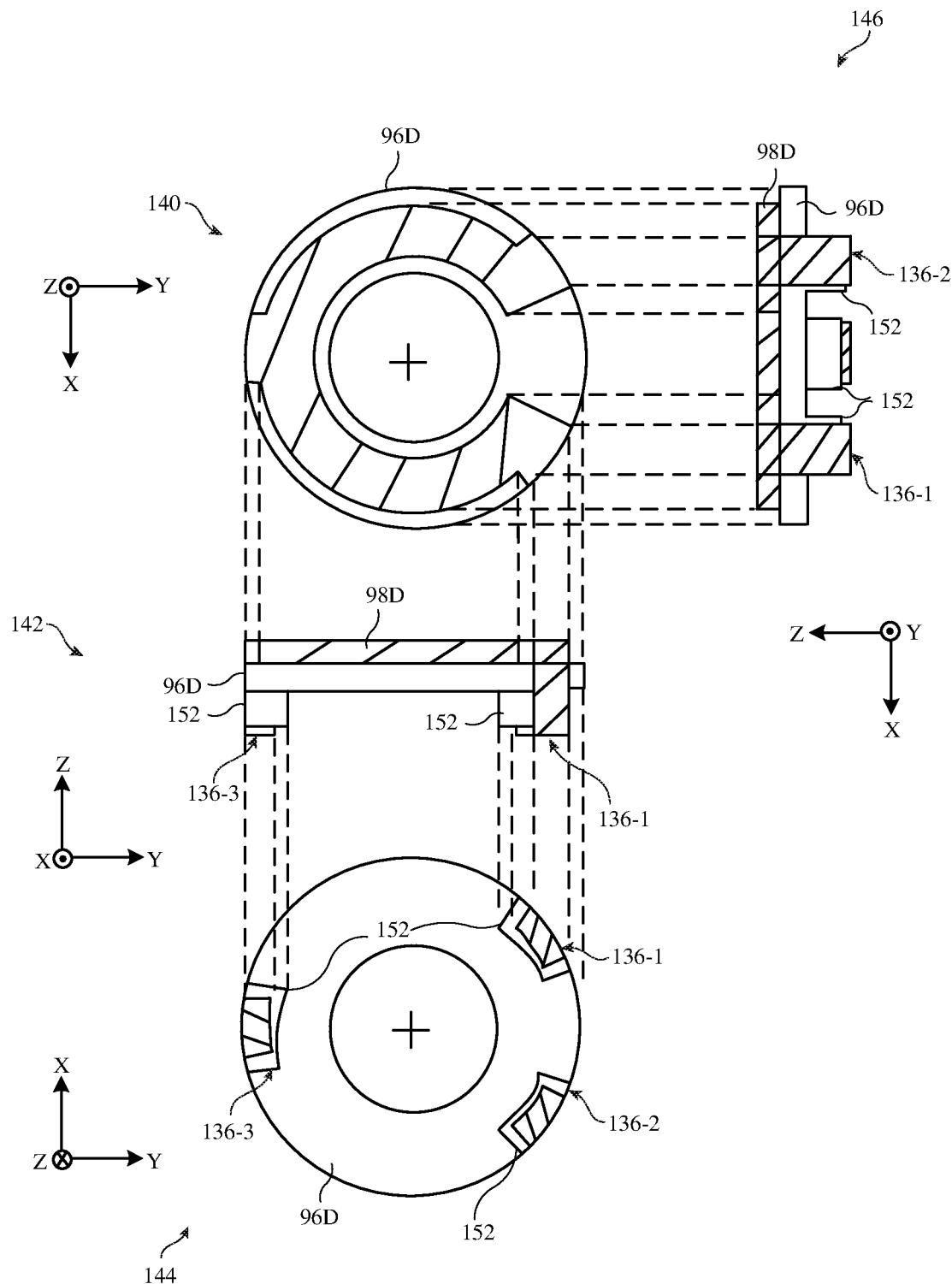
FIG. 13 is a top view, side views, and bottom view of an illustrative drive layer having three contact pads in accordance with some embodiments.

FIG. 13 is a diagram of drive traces 98D in stacked conductor structure 80 in the example where conductive interconnect structures 122 include three contact pads (e.g., with the remaining layers of stacked conductor structure 80 removed for the sake of clarity). As shown in side views 142 and 146 of FIG. 13, contact pad 136-3 is patterned on the bottom surface of a respective leg 152 of dielectric drive layer 96D. Conductive traces are patterned on the side surfaces of legs 152 to couple drive traces 98D to contact pads 136-1, 136-2, and 136-3. Contact pads 136-1, 136-2, and 136-3 may be surface mount contact pads (e.g., reflow-solderable pads) that are soldered to conductive traces 121 of FIG. 7. Contact pad 136-1 may, for example, be coupled to center tap terminals 77 or 79 of FIG. 2 over conductive traces 121 of FIG. 7.

Figure 14:
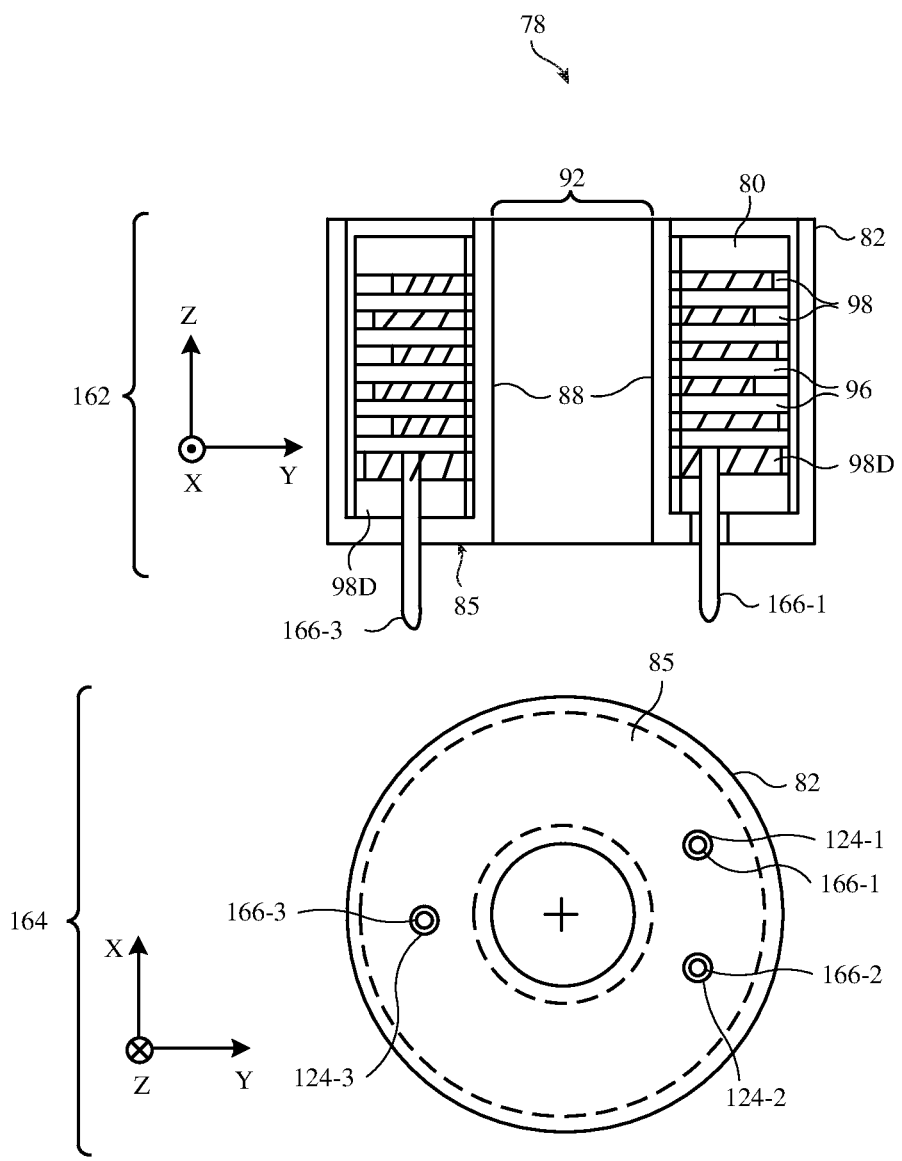
FIG. 14 is a cross-sectional side view and bottom view of illustrative stacked resonant structures that are driven by a drive layer having three contact pins in accordance with some embodiments.

FIG. 14 is a diagram showing how stacked conductor structure 80 is mounted within stacked resonant structures 78 in an example where conductive interconnect structures 122 include three conductive pins.

As shown in bottom view 164 of FIG. 14, bottom wall 84 of magnetic core 82 includes a third opening 124-3. Third opening 124-3 is shown on a side of central axis 85 opposite to openings 124-1 and 124-2 in FIG. 14. This is merely illustrative and, in general, third opening 124-3 may be at any desired location on bottom wall 84 (e.g., interposed between openings 124-1 and 124-2, located at the same side of central axis 85 as openings 124-1 and 124-2, etc.). Stacked conductor structure 80 includes a third conductive pin 166-3 aligned with third opening 124-3. As shown in cross-sectional side view 162 of FIG. 12, third conductive pin 166-3 extends from drive traces 98D in stacked conductor structure 80 and through opening 124-3.

Figure 15:
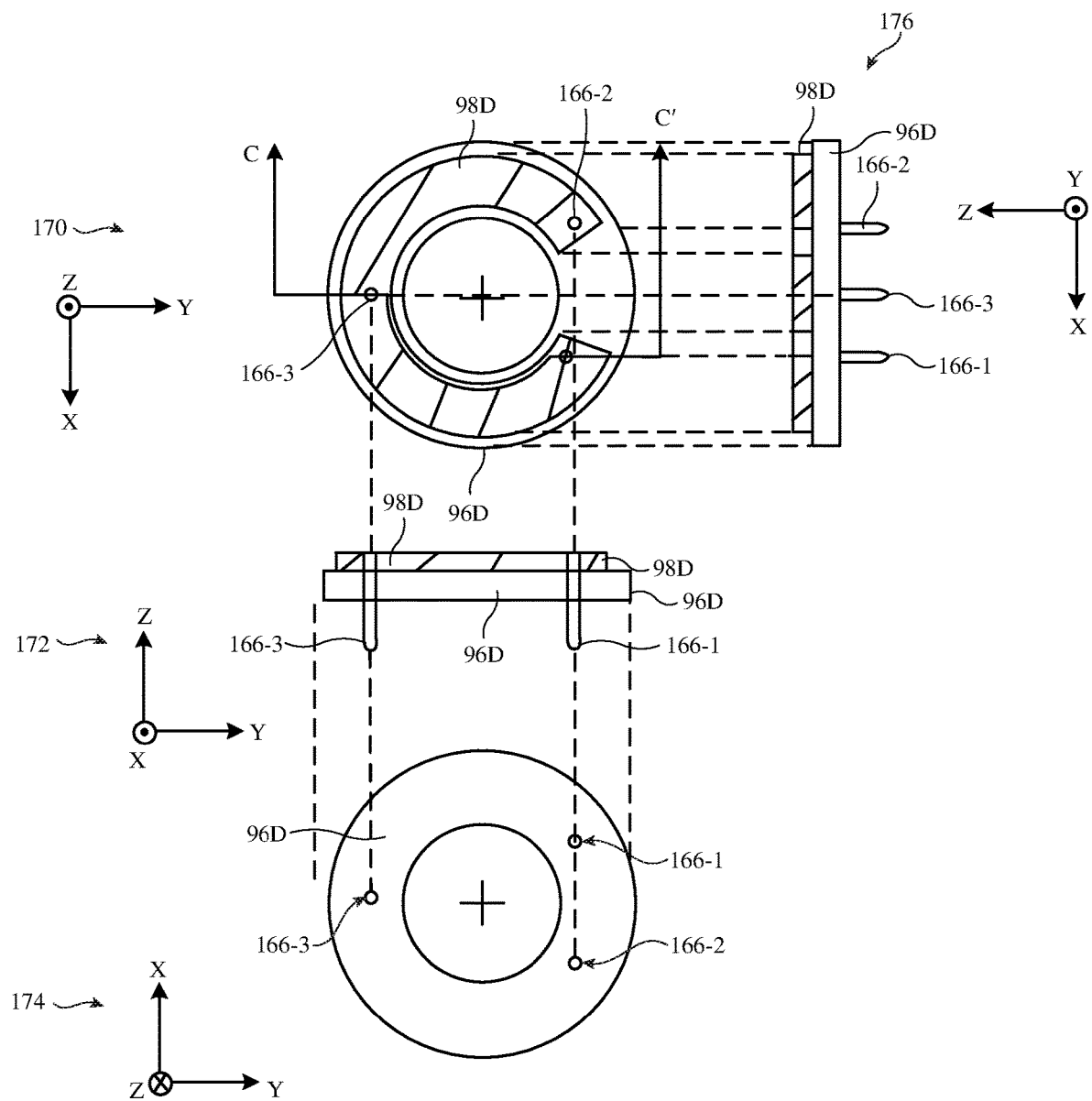
FIG. 15 is a top view, cross-sectional side view, side view, and bottom view of an illustrative drive layer having three contact pins in accordance with some embodiments.

FIG. 15 is a diagram of drive traces 98D in stacked conductor structure 80 in the example where conductive interconnect structures 122 include three conductive pins (e.g., with the remaining layers of stacked conductor structure 80 removed for the sake of clarity). As shown in cross-sectional side view 172 and side view 176 of FIG. 15, conductive pin 166-3 extends from drive traces 98D and through dielectric drive layer 96D. Conductive pins 166-1, 166-2, and 166-3 may be pressed against conductive traces 121 of FIG. 7. Conductive pins 166-1, 166-2, and 166-3 may be soldered or otherwise affixed to conductive traces 121. Conductive pin 166-3 may, for example, be coupled to center tap terminals 77 or 79 of FIG. 2 over conductive traces 121.

Figure 16:
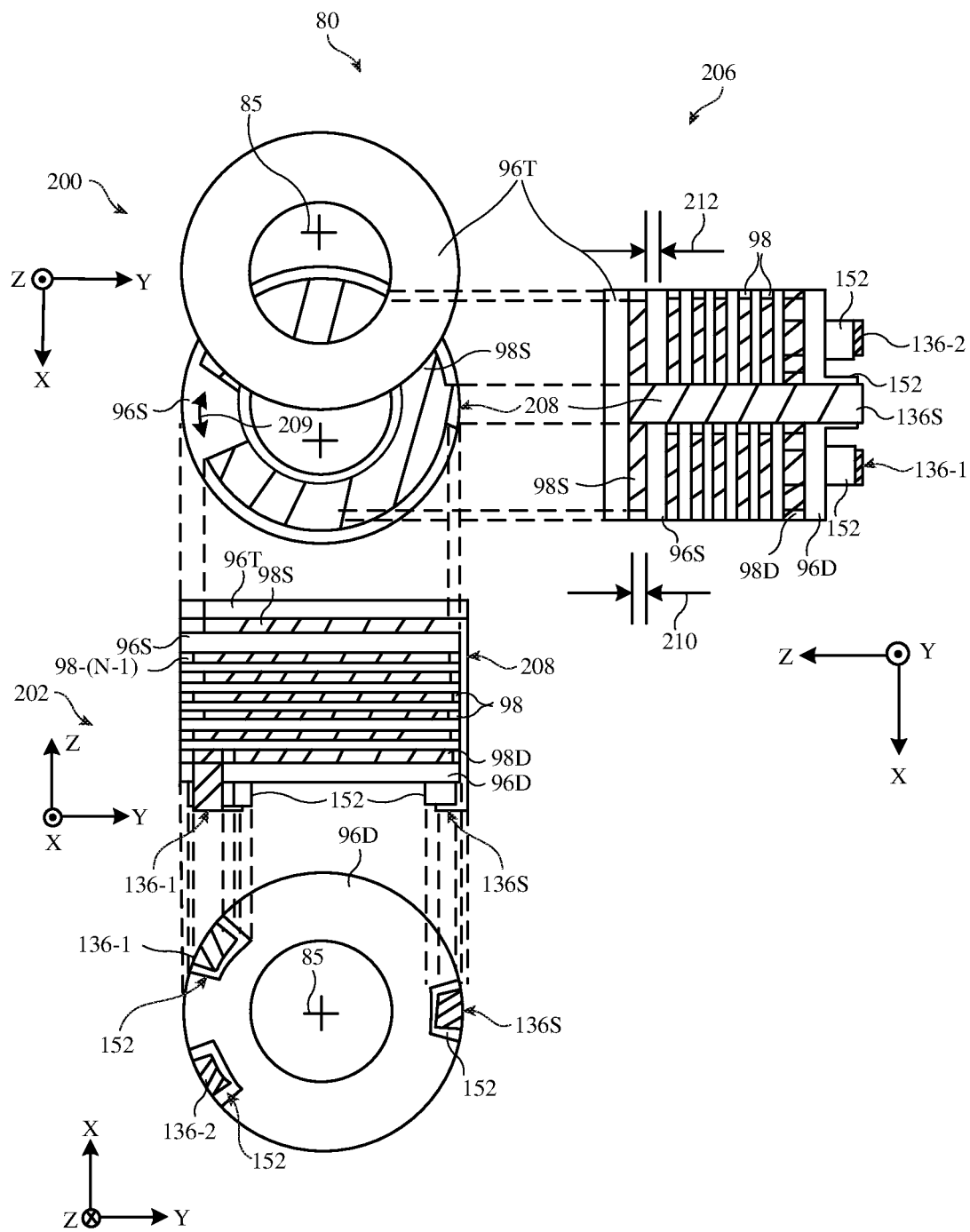
FIG. 16 is a top view, side views, and bottom view of illustrative stacked resonant structures having a shielding layer and a drive layer that is driven using a pair of contact pads in accordance with some embodiments.

If desired, stacked conductor structure 80 may include an integral shield layer. FIG. 16 is a diagram of stacked conductor structure 80 in an example where stacked conductor structure 80 includes an integral shield layer. FIG. 16 depicts a top view 200 of stacked conductor structure 80 (with a top-most dielectric layer 96T removed), side views 202 and 206 of stacked conductor structure 80, and a bottom view 204 of stacked conductor structure 80.

As shown in side views 202 and 206, stacked conductor structure 80 includes (N−1) conductive layers 98 that are driven by drive traces 98D. Stacked conductor structure 80 also includes a conductive layer 98 that forms a shield for stacked conductor structure 80 (referred to herein as (conductive) shield layer 98S). Shield layer 98S is the top-most conductive layer of stacked conductor structure 80 (e.g., the conductive layer closest to the open end of magnetic core 82). Shield layer 98S is patterned onto an underlying dielectric layer 96 (referred to herein as shield dielectric layer 96S). Shield dielectric layer 96S may, for example, form dielectric layer 96-N of FIG. 5 or there may be additional dielectric layers 96 interposed between shield layer 98S and conductive layer 98-(N−1). Top-most dielectric layer 96T may be layered over shield layer 98S or may be omitted if desired. Shield dielectric layer 96S has a thickness 212 that may, if desired, be greater than the thickness 102 (FIG. 5) of the other dielectric layers 96 in stacked conductor structure 80. Shield layer 98S has a thickness 210 that may, if desired, be greater than the thickness 104 (FIG. 5) of the other conductive layers 98 in stacked conductor structure 80.

The N-1 conductive layers 98 underneath shield layer 98S are driven by drive layer 98D. In contrast, shield layer 98S is not driven by drive layer 98D. Shield layer 98S is coupled to shield contact pad 136S at the bottom surface of stacked conductor structure 80 by conductive (grounding) traces 208 extending vertically down the side of stacked conductor structure 80. Shield contact pad 136S is coupled (e.g., soldered) to ground traces or traces at another reference potential in conductive traces 121 of FIG. 7. Shield contact pad 136S is patterned on the bottom surface of a leg 152 that protrudes through a corresponding opening in magnetic core 82. This configures shield layer 98S to serve as an electrostatic shield for stacked conductor structure 80 that optimizes the performance of stacked conductor structure 80.

As shown in top view 200 of FIG. 16, shield layer 98S has a gap 209 about central axis 85 (e.g., central post 88) that prevents shield layer 98S from forming a complete loop around central axis 85. This allows shield layer 98S to optimize the performance of stacked conductor structure 80 without completely blocking stacked resonant structures 78 from conveying signals 44 of FIG. 2. Gap 209 may be the same size as openings 110 in the other conductive layers 98 or may be a different size.

Figure 17:
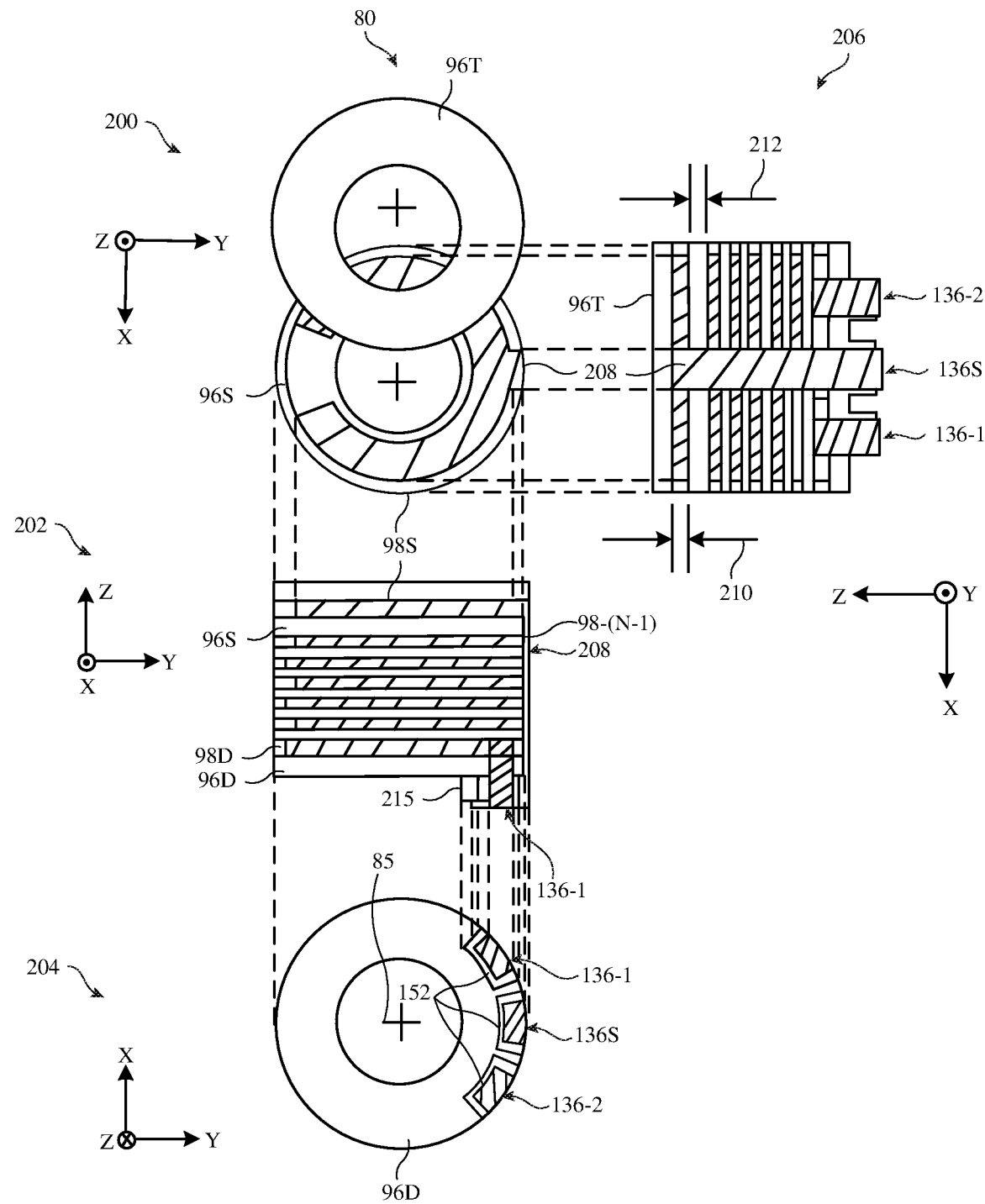
FIG. 17 is a top view, side views, and bottom view of illustrative stacked resonant structures having a shield layer and a drive layer that is driven using a pair of contact pads, where the shield layer has a shield contact pad that is interposed between the pair of contact pads in accordance with some embodiments.

As shown in bottom view 204 of FIG. 16, shield contact pad 136 is located at a side of central axis 85 opposite to contact pads 136-1 and 136-2. This is merely illustrative. If desired, shield contact pad 136 may be located at the same side of central axis 85, as shown in side views 202 and 206 and bottom view 204 of FIG. 17. In the example of FIG. 17, shield contact pad 136S (and the corresponding leg 152) is interposed between contact pads 136-1 and 136-2. This is merely illustrative and, in general, shield contact pad 136S may be disposed at any desired location on stacked conductor structure 80.

Figure 18:
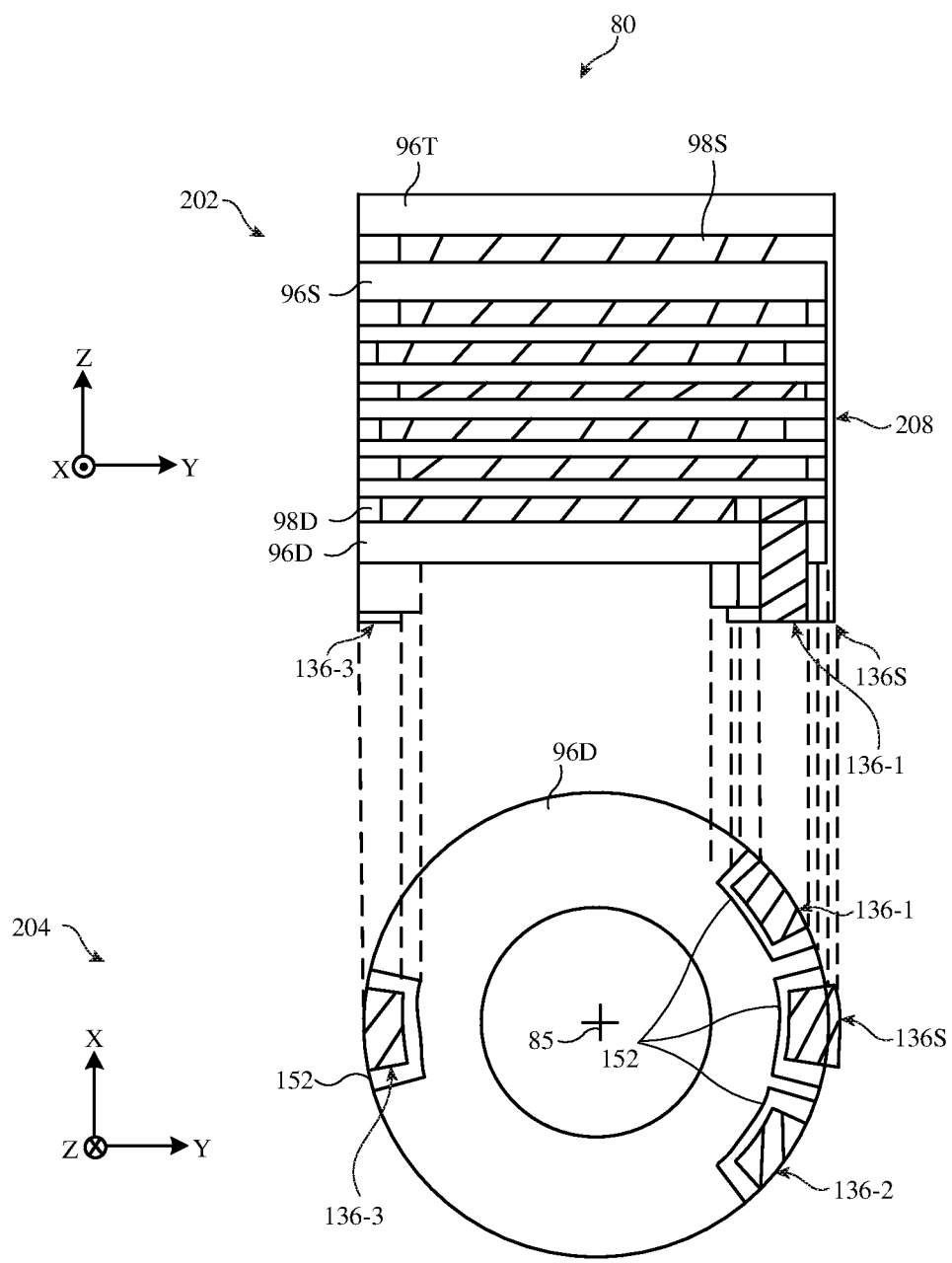
FIG. 18 is a side view and bottom view of illustrative stacked resonant structures having a shield layer and a drive layer that is driven using three contact pads in accordance with some embodiments.

The examples of FIGS. 16 and 17 in which stacked conductor structure 80 includes two contact pads 136-1 and 136-2 in addition to shield contact pad 136S is merely illustrative. FIG. 18 is a diagram showing how stacked conductor structure 80 may include contact pads 136-1, 136-2, and 136-3 in addition to shield contact pad 136S. As shown in bottom view 204 of FIG. 18, third contact pad 136-3 (e.g., a contact pad for a center tap conductor of the inverter or rectifier) is located at a first side of central axis 85 whereas contact pads 136-1 and 136-2 and shield contact pad 136S are located at an opposing second side of central axis 85. This example is merely illustrative. Shield contact pad 136S and contact pads 136-1, 136-2, and 136-3 may be disposed at any desired locations on the bottom surface of stacked conductor structure 80.

The examples of FIGS. 16-18 in which stacked conductor structure 80 includes shield layer 98S and is driven by contact pads is merely illustrative. In another suitable arrangement, contact pads 136-1, 136-2, 136-3 and 136S and legs 152 of FIGS. 16-18 are replaced with conductive pins 166 (e.g., as shown in FIGS. 10, 11, 14, and 15). In this arrangement, a shield conductive pin is coupled to conductive traces 208 to short shield layer 98S to ground traces in conductive traces 121 of FIG. 7. The shield conductive pin may be soldered to the ground traces if desired. The examples of FIGS. 16-18 in which the shield layer is formed integral to stacked conductor structure 80 is merely illustrative. In another suitable arrangement, shield layer 98S is formed from a grounded conductive layer that is placed over stacked conductor structure 80 and overlapping the conductive traces in stacked conductor structure 80 (e.g., shield layer 98S may form a part of stacked resonant structures 78 and may be mounted within magnetic core 82 but external to stacked conductor structure 80, or may be mounted over magnetic core 82 and external to stacked resonant structures 78). If desired, drive traces 98D may include multiple turns (loops) on dielectric layer 96D and about central axis 85 (rather than a single turn or loop as shown in the examples of FIGS. 9, 11, 13, and 15). In these scenarios, conductive vias may extend through dielectric layer 96D to accommodate the multiple turns around central axis 85.

Figure 19:
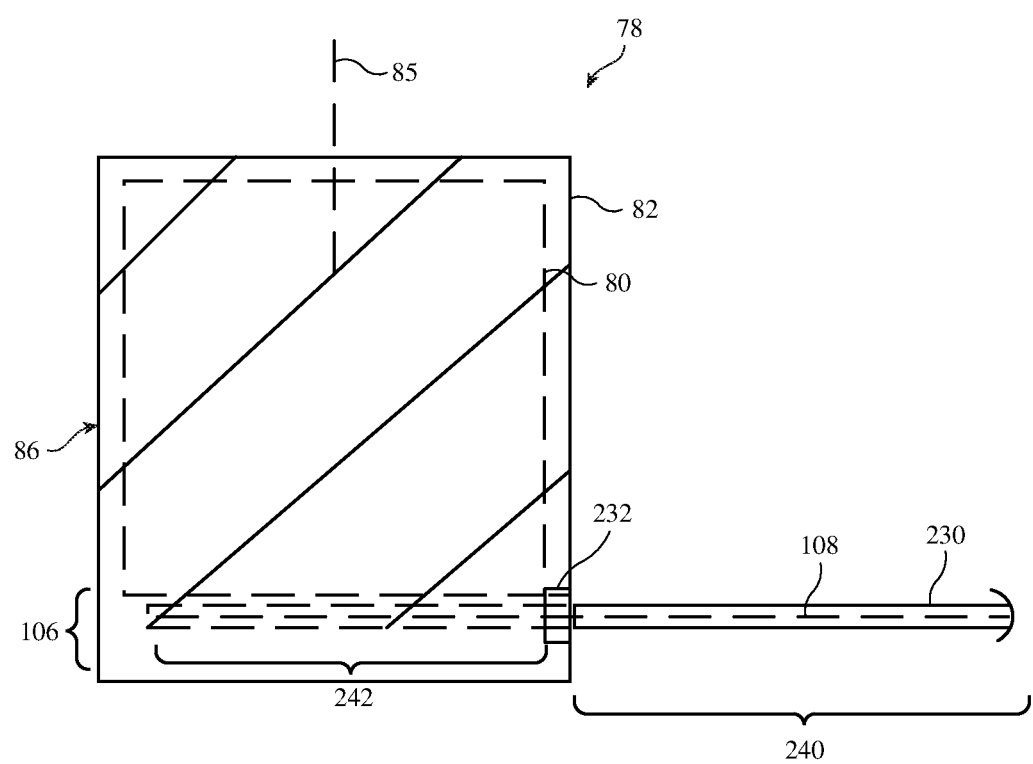
FIG. 19 is a side view of illustrative stacked resonant structures having a stacked conductor structure that is driven by a drive printed circuit board in accordance with some embodiments.

The examples of FIGS. 7-18 in which stacked conductor structure 80 is driven using drive traces 98D (e.g., where driving structures 106 of FIG. 5 are formed from drive traces 98D, conductive interconnect structures 122, conductive traces 121, and substrate 120 of FIG. 7) is merely illustrative. In another suitable arrangement, stacked conductor is fed using a drive printed circuit board (e.g., driving structures 106 of FIG. 5 may include a drive printed circuit board mounted under stacked conductor structure 80). FIG. 19 is a side view showing how stacked resonant structures 78 may be driven using driving structures 106 that include a drive printed circuit board layered under stacked conductor structure 80.

As shown in FIG. 19, driving structures 106 include a drive printed circuit board such as drive printed circuit board 230. Drive printed circuit board 230 may be a flexible printed circuit, a rigid printed circuit board, or other printed circuit board. Drive traces 108 are patterned on drive printed circuit board 230. Drive traces 108 may be coupled to the terminals of host circuitry such as inverter 61 or rectifier 50 of FIG. 2.

Drive printed circuit board 230 extends through opening (hole) 232 in magnetic core 82 of stacked resonator structures 78. Drive printed circuit board 230 has a first portion (region) 242 located within magnetic core 82 and a second portion (region) 240 (sometimes referred to herein as tail 240) that is external to and protruding from magnetic core 82. Stacked conductor structure 80 is mounted to first portion 242 of drive printed circuit board 230 within magnetic core 82. Current driven on drive traces 108 in first portion 242 of drive printed circuit board 230 (e.g., current $I_D$ of FIG. 5) drives stacked resonant structures 78 (e.g., to produce signals 44 of FIG. 2). The example of FIG. 19 is merely illustrative. If desired, stacked resonant structures 78 may include multiple stacked conductor structures 80 within magnetic core 82. For example, stacked resonant structures 78 may include a first stacked conductor structure 80 mounted over first portion 242 of drive printed circuit board 230 and a second stacked conductor structure 80 mounted under first portion 242 of drive printed circuit board 230 (e.g., first portion 242 may be vertically interposed or sandwiched between the first and second stacked conductor structures). In this scenario, current driven on first portion 242 drives both the first and second stacked conductor structures.

Figure 20A:
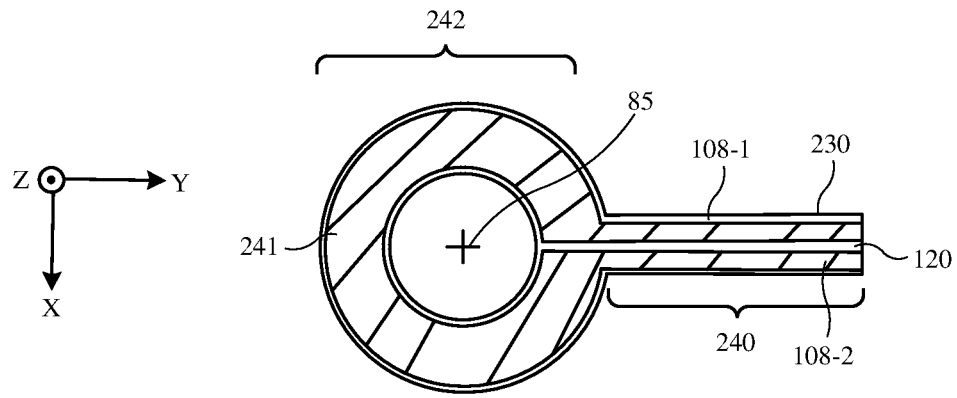
FIGS. 20A-20C are diagrams of an illustrative drive printed circuit board having drive traces with a single turn extending around a central axis of stacked resonant structures in accordance with some embodiments.
Figure 20B:
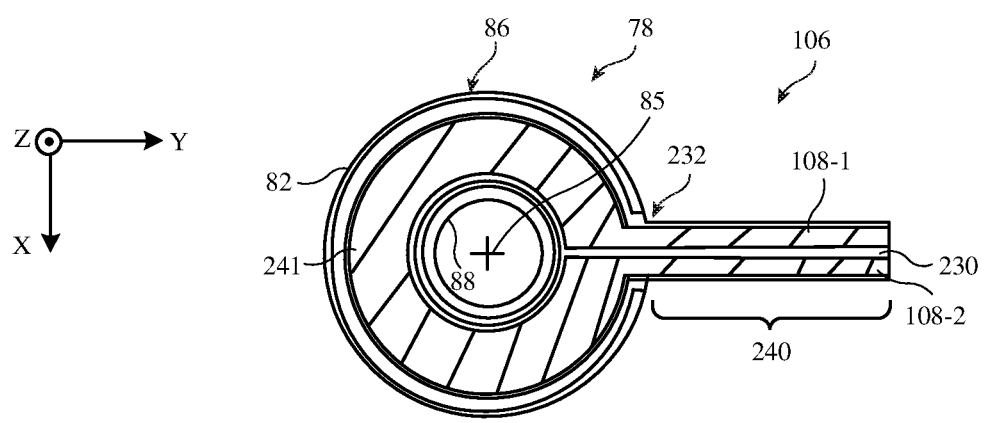
Figure 20C:
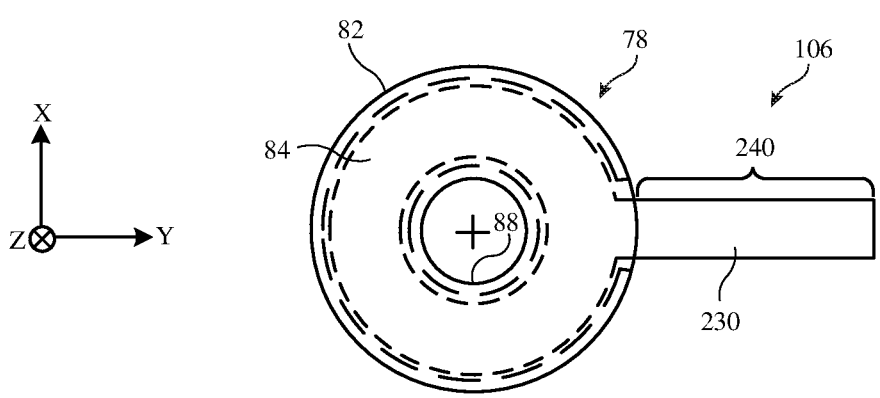

FIGS. 20A-20C show drive printed circuit board 230 in an example where drive traces 108 include a single turn of conductive traces around central axis 85 of stacked resonant structures 78. FIG. 20A is a top view of drive printed circuit board 230 without magnetic core 82 or the overlying stacked conductor structure 80. As shown in FIG. 20A, drive traces 108 include a first drive trace 108-1 and a second drive trace 108-2 on tail 240. Drive traces 108-1 and 108-2 may be respectively coupled to first and second terminals of host circuitry such as inverter 61 or rectifier 50 of FIG. 2, for example.

Portion 242 of drive printed circuit board 230 extends around central axis 85 (e.g., around opening 92 in the overlying stacked conductor structure 80). Drive traces 108 on drive printed circuit board 230 include a single turn or loop 241 coupled between drive traces 108-1 and 108-2 and extending around central axis 85 on portion 242. Drive current (e.g., current $I_D$ of FIG. 5) flows between drive traces 108-1 and 108-2 and around loop 241 to create a magnetic field (e.g., magnetic field B of FIG. 5) that inductively couples into the overlying stacked conductor structure 80 (e.g., to produce current I on conductive layers 98 of FIG. 5).

FIG. 20B is a top view of drive printed circuit board 230 inserted within magnetic core 82 but without the overlying stacked conductor structure 80. As shown in FIG. 20B, portion 242 of drive printed circuit board 230 extends around central post 88 and lies within magnetic core 82 (e.g., drive printed circuit board 230 is laterally interposed between central post 88 and sidewalls 86). Stacked conductor structure 80 is mounted on top of portion 242 within magnetic core 82.

FIG. 20C is a bottom view of drive printed circuit board 230 inserted within magnetic core 82. As shown in FIG. 20C, tail 240 is external to and protruding from magnetic core 82.

Figure 21A:
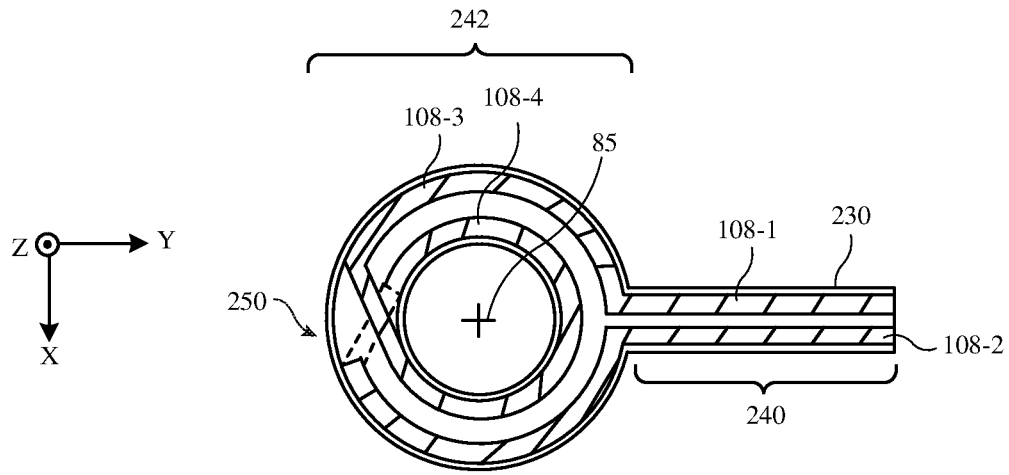
FIGS. 21A-21C are diagrams of an illustrative drive printed circuit board having drive traces with multiple turns extending around a central axis of stacked resonant structures in accordance with some embodiments.
Figure 21B:
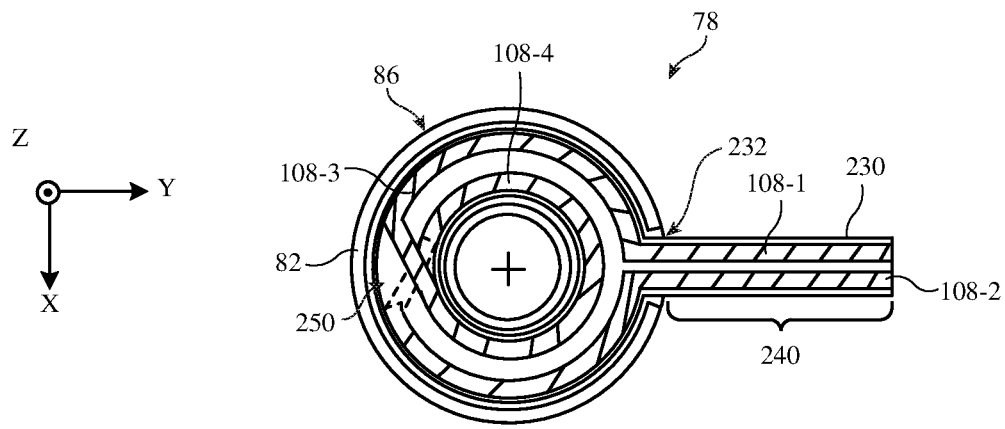
Figure 21C:
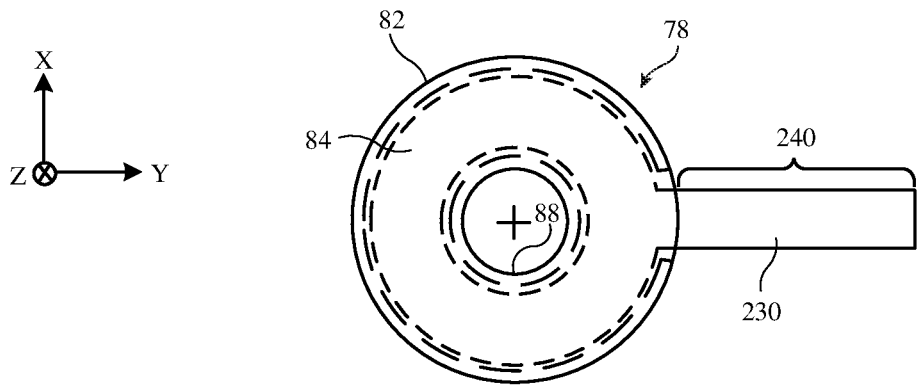

The example of FIGS. 20A-20C in which portion 242 of drive printed circuit board 230 includes only a single turn or loop of conductive traces about central axis 85 is merely illustrative. FIGS. 21A-21C show drive printed circuit board 230 in an example where drive traces 108 include two turns of conductive traces around central axis 85 of stacked resonant structures 78.

FIG. 21A is a top view of drive printed circuit board 230 without magnetic core 82 or the overlying stacked conductor structure 80. As shown in FIG. 21A, drive traces 108 include drive traces 108-3 extending in a first (e.g., outer) loop around central axis 85 and drive traces 108-4 extending in a second (e.g., inner) loop around central axis 85. Drive traces 108-3 are coupled to drive traces 108-1 and 108-2. Drive traces 108-3 are coupled to drive traces 108-4 at cross-over 250. Cross-over 250 allows drive traces 108 to wrap around central axis 85 multiple times without each loop shorting together. For example, drive printed circuit board 230 may include multiple dielectric layers, where a dielectric layer above or beneath the dielectric layer used to support conductive traces 108-3 and 108-4 is used to form cross-over 250 (e.g., cross-over 250 may include conductive vias extending through one or more of the dielectric layers or a dielectric interposer may be used to prevent shorting of conductive traces 108-3 and 108-4). When arranged in this way, drive traces 108 are provided in a balanced winding arrangement about central axis 85. This is merely illustrative and, in general, drive traces 108 need not be balanced about central axis 85. FIG. 21B is a top view of drive printed circuit board 230 inserted within magnetic core 82 but without the overlying stacked conductor structure 80. FIG. 21C is a bottom view of drive printed circuit board 230 inserted within magnetic core 82.

Figure 22A:
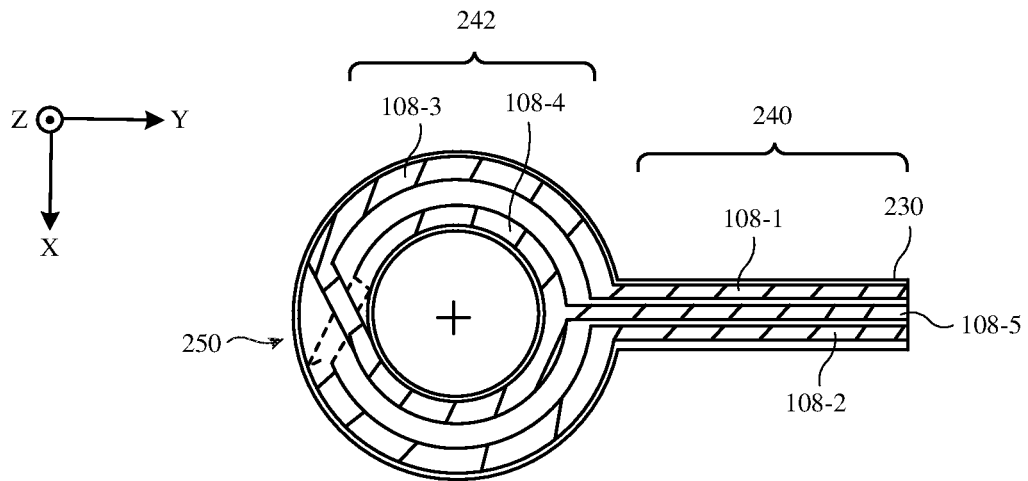
FIGS. 22A-22C are diagrams of an illustrative drive printed circuit board having drive traces with multiple turns extending around a central axis of stacked resonant structures and having a center tap trace in accordance with some embodiments.
Figure 22B:
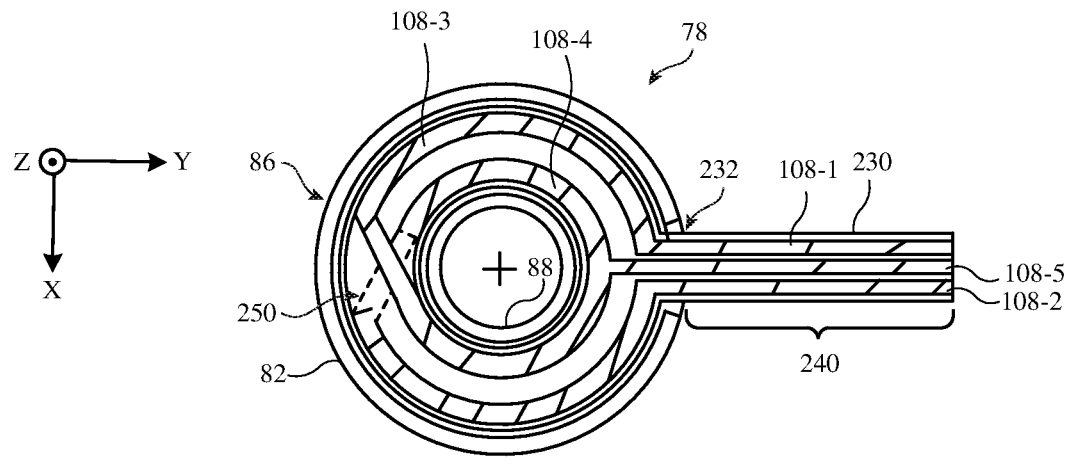
Figure 22C:
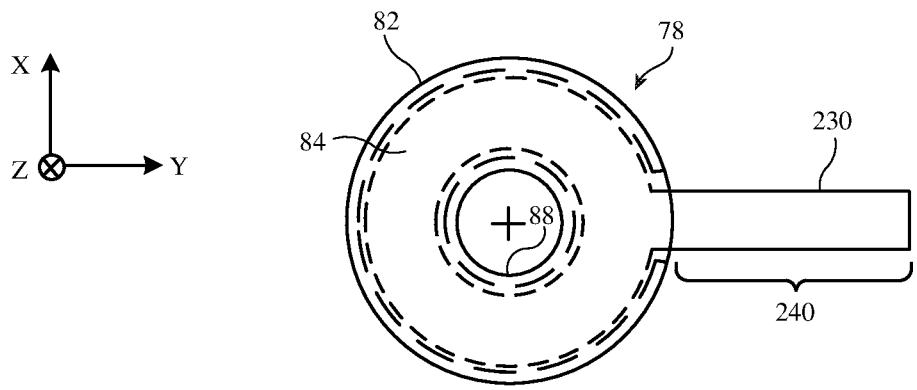

The example of FIGS. 20A-21C in which drive printed circuit board 230 includes two drive traces 108-1 and 108-2 coupled to the terminals of inverter 61 or rectifier 50 (FIG. 2) is merely illustrative. In another suitable arrangement, drive printed circuit board 230 includes three drive traces coupled to the terminals of inverter 61 or rectifier 50. FIGS. 22A-22C show drive printed circuit board 230 in an example where drive printed circuit board 230 includes three drive traces coupled to the terminals of host circuitry such as inverter 61 or rectifier 50.

FIG. 22A is a top view of drive printed circuit board 230 without magnetic core 82 or the overlying stacked conductor structure 80. As shown in FIG. 22A, drive traces 108 include an additional drive trace 108-5 on tail 240. Drive trace 108-5 may, for example, be coupled to the center tap terminal of inverter 61 or rectifier 50 (FIG. 2). In the example of FIG. 22A, drive trace 108-5 is coupled to the inner loop of drive trace 108-4. When arranged in this way, drive traces 108 are provided in a balanced winding arrangement about central axis 85. This is merely illustrative and, in general, drive traces 108 need not be balanced about central axis 85. FIG. 22B is a top view of drive printed circuit board 230 inserted within magnetic core 82 but without the overlying stacked conductor structure 80. FIG. 22C is a bottom view of drive printed circuit board 230 inserted within magnetic core 82.

In general, drive traces 108 may include any desired number of turns or loops about central axis 85 (e.g., one turn as shown in FIGS. 20A-20C, two turns as shown in FIGS. 21A-22C, three turns, four turns, more than four turns, etc.). Providing drive traces 108 with an even number of turns may, for example, allow drive traces 108 to exhibit a balanced driving arrangement. However, drive traces 108 need not be balanced. If desired, shield layer 98S of FIGS. 16-18 may be provided over stacked conductor structure 80 and coupled to ground traces or other traces held at a reference potential on drive printed circuit board 230 in arrangements where stacked resonant structures 78 are driven using drive printed circuit board 230 of FIGS. 19-22C.

The foregoing is merely illustrative and various modifications can be made to the described embodiments. The foregoing embodiments may be implemented individually or in any combination.

What is claimed is:

1. A wireless power receiving device configured to receive wireless power signals transmitted by a wireless power transmitter, the wireless power receiving device comprising:
stacked resonant structures configured to receive the wireless power signals, wherein the stacked resonant structures comprise:
a magnetic core having a central post,
stacked dielectric layers within the magnetic core and laterally surrounding the central post and including a dielectric drive layer, and
conductive layers interleaved with the stacked dielectric layers, wherein the conductive layers comprise openings about the central post and wherein adjacent pairs of the conductive layers contribute series capacitances to the stacked resonant structures;
a substrate external to the magnetic core;
drive traces on the substrate, wherein the magnetic core has first and second openings, the dielectric drive layer having a first leg protruding through the first opening and a second leg protruding through the second opening;
a first contact pad on the first leg and soldered to the drive traces;
a second contact pad on the second leg and soldered to the drive traces; and
rectifier circuitry coupled to the drive traces, wherein the rectifier circuitry is configured to produce direct-current power from the wireless power signals received by the stacked resonant structures.

2. The wireless power receiving device of claim 1, wherein the conductive layers comprise even-numbered layers and odd-numbered layers, wherein the even-numbered layers comprise first openings about the central post that are oriented in a first direction, and wherein the odd-numbered layers comprise second openings about the central post that are oriented in a second direction antiparallel to the first direction.

3. The wireless power receiving device of claim 1, wherein the conductive layers comprise additional drive traces on the dielectric drive layer and extending around the central post, and wherein a current on the conductive layers produced by the received wireless power signals induces an alternating current on the additional drive traces, wherein the rectifier circuitry is configured to produce the direct-current power based on the alternating current on the drive traces, and wherein the first and second contact pads form part of respective first and second conductive interconnect structures that couple respective first and second locations on the drive traces to the rectifier circuitry.

4. The wireless power receiving device of claim 3, further comprising a third conductive interconnect structure that couples a third location on the drive traces to a center tap terminal of the rectifier circuitry.

5. The wireless power receiving device of claim 4, wherein the first and second conductive interconnect structures are located at a first side of the central post and wherein the third conductive interconnect structure is located at a second side of the central post.

6. The wireless power receiving device of claim 5, further comprising:
a shield layer overlapping the conductive layers; and
a fourth conductive interconnect structure that couples the shield layer to a ground trace.

7. The wireless power receiving device of claim 4, wherein the third conductive interconnect structure is laterally interposed between the first and second conductive interconnect structures.

8. The wireless power receiving device of claim 3, further comprising:
a shield layer aligned with the central post and overlapping the conductive layers, wherein the shield layer has a gap about the central post; and
a third conductive interconnect structure that couples the shield layer to a reference potential.

9. The wireless power receiving device of claim 8, wherein the first and second conductive interconnect structures are located at a first side of the central post and wherein the third conductive interconnect structure is located at a second side of the central post.

10. The wireless power receiving device of claim 8, wherein the third conductive interconnect structure is laterally interposed between the first and second conductive interconnect structures.

11. The wireless power receiving device of claim 1, wherein the wireless power receiving device comprises an electronic device selected from a group consisting of: a cellular telephone, a tablet computer, a wristwatch, a laptop computer, and an earbud.

12. The wireless power receiving device of claim 1, wherein the stacked dielectric layers comprise ceramic.

13. The wireless power receiving device of claim 1, wherein the stacked resonant structures exhibit a self-resonance and a capacitance coupled in parallel with an inductance, the capacitance comprising the series capacitances.

14. The wireless power receiving device of claim 13, wherein an adjacent pair of the conductive layers collectively includes conductive material forming a complete loop around the central post.

15. The wireless power receiving device of claim 14, wherein the conductive layers comprise C-shaped conductive layers.

16. The wireless power receiving device of claim 15, wherein the adjacent pair of the conductive layers comprises a first C-shaped conductive layer having a first orientation and a second C-shaped conductive layer having a second orientation anti-parallel to the first orientation.

17. The wireless power receiving device of claim 1, further comprising a shield layer that overlaps the stacked dielectric layers.

18. The wireless power receiving device of claim 12, wherein the ceramic comprises a class-1 ceramic material.

19. The wireless power receiving device of claim 18, wherein the class-1 ceramic material comprises a C0G ceramic.

20. The wireless power receiving device of claim 18, wherein the class-1 ceramic material comprises an NP0 ceramic.

* * * * *